United States Patent [19]
Fuller et al.

[11] Patent Number: 5,771,301
[45] Date of Patent: Jun. 23, 1998

[54] SOUND LEVELING SYSTEM USING OUTPUT SLOPE CONTROL

[75] Inventors: Charles H. Fuller, Oceanside, Calif.; John D. Winslett, 1024 Granvia Altamira, Palos Verdes, Calif. 92058-6197

[73] Assignee: John D. Winslett, Palos Verdes, Calif.

[21] Appl. No.: 306,697

[22] Filed: Sep. 15, 1994

[51] Int. Cl.[6] ........................................ H03G 3/00
[52] U.S. Cl. ........................ 381/107; 381/104; 381/106; 381/94.8
[58] Field of Search .................................. 381/107, 106, 381/104, 94, 103, 108, 94.8; 333/14

[56] References Cited

U.S. PATENT DOCUMENTS

| | | |
|---|---|---|
| 3,991,370 | 11/1976 | Pate . |
| 4,105,976 | 8/1978 | Payden . |
| 4,296,278 | 10/1981 | Cullison et al. . |
| 4,442,546 | 4/1984 | Ishigaki ...................................... 381/94 |
| 4,455,676 | 6/1984 | Kaneda ..................................... 381/106 |
| 4,701,953 | 10/1987 | White ....................................... 381/106 |
| 4,944,015 | 7/1990 | Juve et al. ................................. 381/55 |
| 5,130,665 | 7/1992 | Walden . |
| 5,164,830 | 11/1992 | Kim . |
| 5,170,437 | 12/1992 | Strahm .................................... 381/106 |
| 5,189,705 | 2/1993 | Lavaud .................................... 381/104 |

*Primary Examiner*—Minsun Oh Harvey
*Attorney, Agent, or Firm*—Loeb & Loeb LLP

[57] ABSTRACT

A sound leveling system for maintaining an output signal below a slope of predetermined maximum output levels includes a signal adjusting circuit, an integrator, and a peak rate limiter circuit. The signal adjusting circuit receives input signals and a control signal to produce the output signal that are output by the system. The signal adjusting circuit uses the control signal from the integrator circuit with the input signal to produce a gain that adjusts the output signal in accordance with the control signal such that output signal is maintained below the slope of predetermined maximum output levels. The integrator circuit is coupled to the signal adjusting circuit to receive and sample the produced output signal. The integrator circuit then determines a maximum amplitude of the output signal and uses the maximum amplitude to produce the control signal. The control signal determines a rate of response of the system, a control threshold, and a level of output slope control applied to the output signal. The peak rate limiter circuit is coupled to the integrator circuit to limit the rate of response of the integrator circuit during sudden, large changes in the maximum amplitude of the output signal to substantially eliminate the loss of signal or silent periods during the large changes in maximum amplitude.

2 Claims, 20 Drawing Sheets

SOUND LEVELING SYSTEM USING OUTPUT SLOPE CONTROL

FIELD OF THE INVENTION

This invention relates to a sound leveling system for reducing or substantially eliminating loud sound level changes caused by sudden transitions between stations, commercials and regular television broadcasts. In particular embodiments, the sound leveling system can be set to maintain the sound levels, produced from a signal, below a slope of predetermined output volume levels without distortion.

BACKGROUND OF THE INVENTION

Electrical and other sound systems have been developed for controlling the maximum output, or keeping the maximum output constant, with wide variations in the input signal amplitudes. The frequency range on these systems is typically between the low sub-audio and the super-high radio frequencies. These systems are usually described as a sub-component within a dedicated system or application. Typical prior art systems have suffered from several disadvantages such as limited dynamic range, overshoot and undershoot, and stability problems that require a compromise of gain and filter coefficients. Moreover, these systems are usually limited to a single data channel, and the results are often difficult to reproduce.

Many of the typical systems reduce the maximum output volume for the peak amplitudes in the signal by either clipping the loud sound signals such that the peak sounds are essentially eliminated or by attenuating the sound signal such that the portions of the signal below the maximum output volume are distorted.

Moreover, many of the prior art systems have suffered from variable "attack" and "decay-recovery" times that are a function of threshold and/or signal input levels. These variable times often result from a gain multiplier and nonlinear rectifier/filter combinations used within a control loop to reduce the peak output volume of the signal. Another, more serious effect in these systems has been the total loss of signal after a large input amplitude change, since the peak signal rectifiers in these systems charge more quickly than the control system can be allowed to reduce the gain, which results in a partial or total signal loss. When the signal is lost, the control loop runs in an unstable and variable time open-loop condition.

Other limitations of typical prior art systems has been little or no visual indication to the user of the amount of gain reduction or gain slope control in the system. This makes it difficult for the user to take corrective steps to affect or control signal amplitude the induced problems.

An alternative, to these typical prior art systems, has been to use an Automatic Gain Control (AGC) circuit in radio systems (i.e., AM/FM/VIDEO/DATA). However, these AGC circuits only control the carrier and control signals associated with the information carried in a signal and are not very effective in altering the audio signals. Thus, typical AGC circuits do not control the signal output based on the information contained within the audio signal. Moreover, typical AGC circuits still suffer from the same clipping and signal loss of an output signal after a large input amplitude change as discussed above.

SUMMARY OF THE DISCLOSURE

According to an embodiment of the present invention, a sound leveling system receives an input signal, and when the amplitude of the input signal equals or exceeds a control threshold, it maintains the output signal at or below a slope defining a plurality of predetermined maximum output levels for a set level of output control. The slope is defined as the ratio of the output signal to the input signal. The sound leveling system includes a signal adjusting circuit, an integrator, and a peak limiter circuit. The signal adjusting circuit receives an input signal and a control signal to produce the output signal that is output by the system. The signal adjusting circuit, which is a two channel gain tracking network, uses the control signal from the integrator circuit to produce a gain that adjusts the output signal in accordance with the control signal such that the maximum amplitude of the output signal is maintained at or below the slope defining the plurality of predetermined maximum output levels for the set level of output control. The integrator circuit output is coupled to the signal adjusting circuit and its input receives an equivalent DC voltage that is a sample of the two channel outputs. The integrator circuit then determines a maximum amplitude of the output signal and uses the maximum amplitude to produce the control signal. This control signal determines the rate and gain slope response of the system, and determines the control threshold in accordance with the level of output control applied to the output signal. The peak limiter circuit is coupled to the integrator circuit to limit the rate of response of the integrator circuit during large changes in the amplitude of the output signal to substantially eliminate the loss of signal or silent periods during the large changes in amplitude of the output signal.

In particular embodiments of the present invention, the sound leveling system further includes a two channel summing AC-to-DC converter circuit coupled between the signal adjusting circuit and the integrator circuit to convert the output signal into a DC control signal. The integrator circuit then produces the control signal based upon this control signal. In other embodiments, the sound leveling system includes a display device for displaying an indication of the amount of output slope control being applied to the signal adjusting circuit.

In further embodiments of the present invention, the integrator sets the control signal such that the control signal causes the signal adjusting circuit to change the gain at a high rate when a large increase in the maximum amplitude of the output signal is detected and to change the gain at a slow rate when the maximum amplitude of the output signal is reduced. In preferred embodiments, the sound leveling system further includes a rate adjustment switch so that the rate of decreasing and increasing the gain is set by activation of the rate adjustment switch. In other embodiments, the sound leveling system includes an override switch, such that the level of the output slope control is set to a maximum value when the override switch is activated.

Also, in preferred embodiments of the present invention, the inputs are two separate audio signal channels such as a stereo signal or two monophonic sound signals, and the output of the sound leveling system is two corresponding output channels which preserve the instantaneous input amplitude and signal ratios (proportionality) while maintaining a maximum output level. Each of the previous input channels may be the mixed sum of two or more stereo sources and the amplitude ratios will be preserved.

In an alternative embodiment, the sound leveling system further includes an inverting circuit for inverting the phase of one input channel signal and a voice nulling circuit which uses the inverted and the non-inverted input channel signals to substantially cancel the voice energy portions in the two output channel signals.

Other features and advantages of the invention will become apparent from the following detailed description, taken in conjunction with the accompanying drawings which illustrate, by way of example, various features of embodiments of the invention.

BRIEF DESCRIPTION OF THE DRAWINGS

A detailed description of embodiments of the invention will be made with reference to the accompanying drawings, wherein like numerals designate corresponding parts in the several figures.

DETAILED DESCRIPTION OF THE PREFERRED EMBODIMENTS

Figure 1:
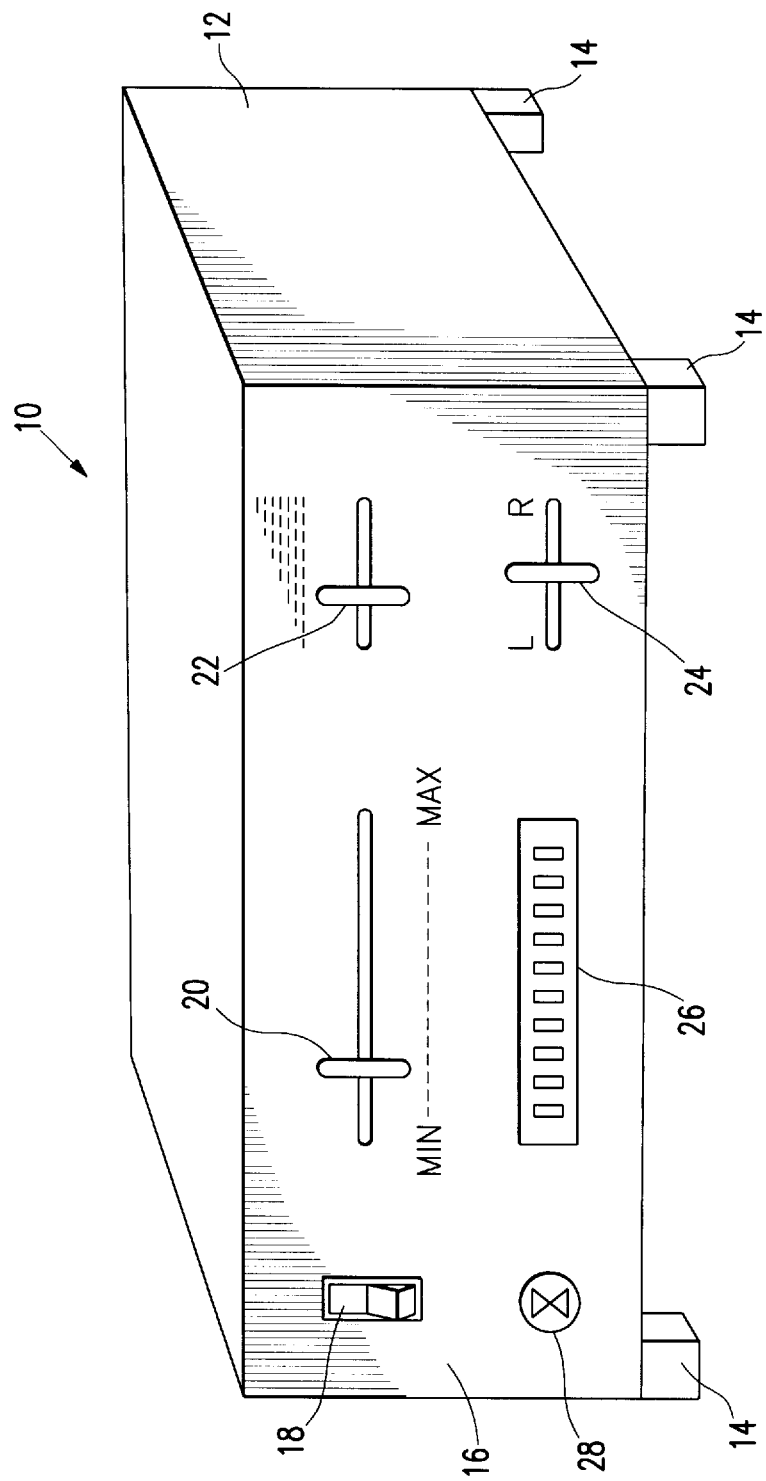
FIG. 1 is a perspective view of a sound leveling system in accordance with an embodiment of the present invention.

The present invention is embodied in a sound leveling system for maintaining sound levels below a predetermined threshold without distortion. In preferred embodiments of the present invention, the sound leveling system is for use with a television, a stereo or a radio. However, it will be recognized that further embodiments of the invention may be used with more than one television, stereo or radio, or may be used with telephones, video cassette recorders (VCRs), musical instruments or the like, to maintain sound levels between specified upper and lower output level slopes with substantially little or no distortion. Moreover, embodiments of the sound leveling system may be incorporated into a stand alone system that can be adapted to existing equipment or may be incorporated into televisions and radios as part of the internal circuitry. In still further embodiments, the sound leveling system may be incorporated into public address (PA) systems or commercial background music systems, cable TV systems, computer sound cards, or high frequency data signals.

In preferred embodiments, the sound leveling system limits the top end volume and keeps the sound output volume at or below a maximum output volume slope level without clipping or distortion. In other embodiments of the invention, the sound leveling system will work with both stereo and/or mono sound or RF or digital systems. Preferred embodiments are designed to limit the increase in sound normally encountered when a commercial comes on between segments of a program, since commercials typically produce a higher sound level. In particular embodiments, one channel (i.e., the left) is inverted with respect to the other channel (i.e., the right), such that the commercials, which are typically monophonic and thus have the signal equally distributed in both channels, are effectively eliminated. Also, in particular embodiments, the sound leveling system maintains an optimum preset output volume level regardless of the channel or program selected. Therefore, the user can change channels without any substantial increase in output volume.

Embodiments of the invention measure the total sum of outputs of the sound signal from the television or stereo system as a voltage control signal. In preferred embodiments, the output is measured across the design selected spectrum rather than at a flat bandwidth. Then the voltage signal is automatically reduced to a voltage level which matches the level along an output volume slope corresponding to the maximum sound output volume level. Thus, the sound signal is not filtered or clipped off as in typical prior art systems. In particular embodiments, output signals corresponding to signals below the threshold level are proportionally attenuated to preserve the signal relationship between the different amplitudes that are simultaneously contained in the composite input signal. However, in alternative embodiments, the voltage levels below the maximum output volume level are maintained by adjusting the gain and the threshold so that the output for these voltage levels are substantially the same as if the signal had not been altered or adjusted in any manner.

In particular embodiments of the invention, the sound leveling system is incorporated in external speakers that a consumer can install. Alternatively, the sound leveling system may be inserted between the television or stereo and existing speakers. In another alternative, the sound leveling system may be actually incorporated into the circuits of the television or stereo system during manufacturing. In other embodiments, the sound leveling system may be incorporated into a cable TV decoder or VCR that can be coupled to a TV or stereo. In still other embodiments, the sound leveling system may be incorporated in a transmitter used by a broadcaster or a cable operator to provide various levels of sound leveling prior to the viewer receiving the signal. In yet another embodiment, the sound leveling system may be incorporated into an audio sound card, or the like, for a computer controlled sound system.

In further embodiments, the output volume level is adjustable by the user, who can adjust the output level, using knobs, buttons, or the like to a desired output level. Furthermore, in particular embodiments, the user can also set the rates at which the gain that adjusts the output signal are increased or decreased in response to a change in the input signal magnitude.

Figure 7:
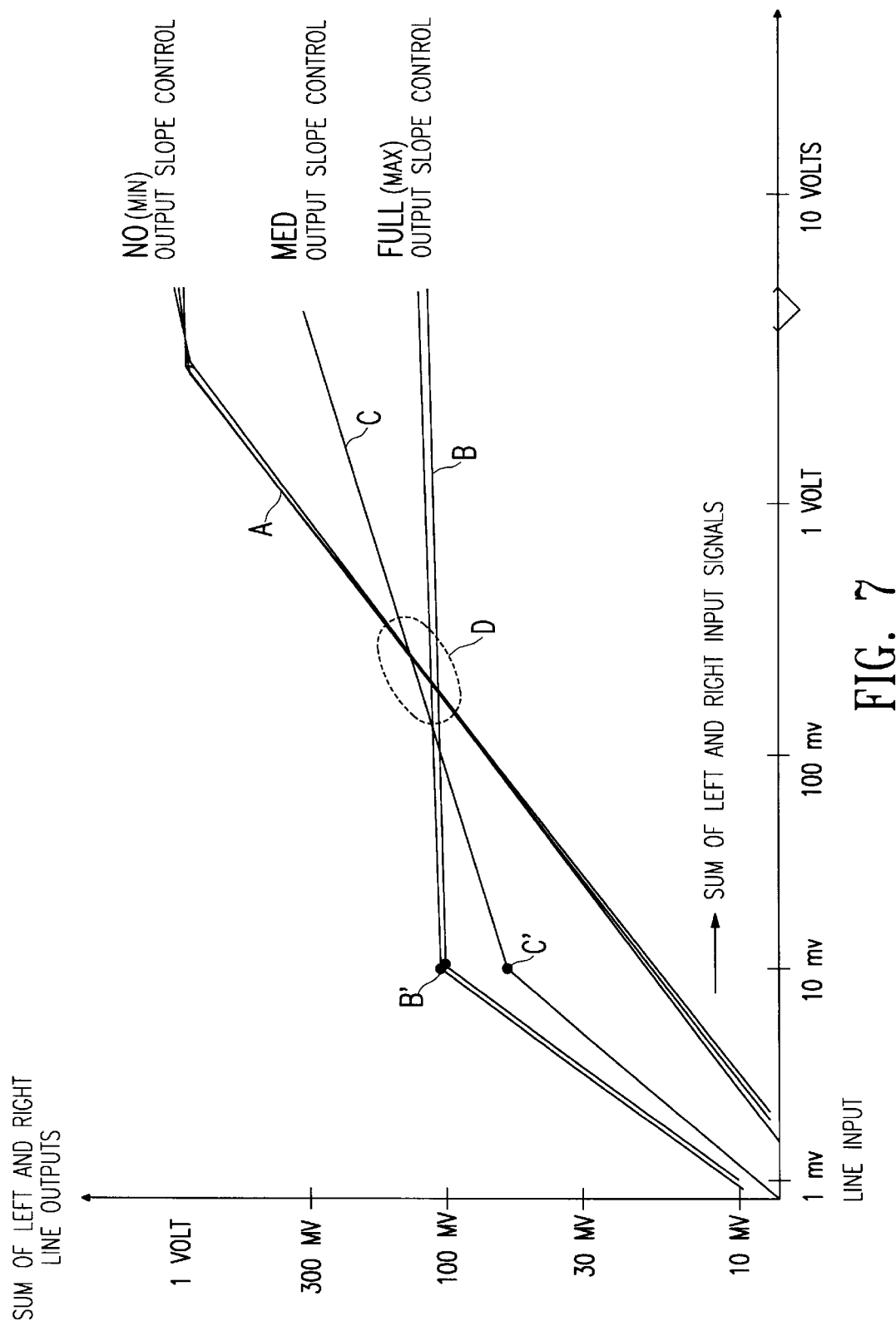
FIG. 7 is a graph illustrating the effects of different slope control settings on both output and display.

Particular aspects of the present invention can be best understood with reference to the graph shown in FIG. 7. The horizontal axis represents the average line input value, which is the average of the peak DC equivalent sum of the right and left channel input signals during a time interval of 10 milliseconds. The vertical axis represents the sum of the maximum line output signal level to the line outputs or power amplifier outputs.

Line A illustrates the curve for a system that uses zero (i.e., min.) slope control. In this scenario, the maximum line output level is directly proportional to the maximum line input level. Moreover, the response time for the line output level to respond to a change in the line input level is essentially instantaneous. Thus, as the line input level increases, the line output level will increase proportionally until the system reaches saturation.

Line B illustrates the curve for a system that uses the maximum amount of output slope control in accordance with embodiments of the present invention. In this scenario, the curve is divided into two portions having different slopes, that intersect at a control point or threshold B' at the knee of the curve B. Below the threshold B', the maximum line output level is proportional to the maximum line input level. Above the threshold B', the maximum line output level is a function of the maximum line input levels and an output slope control signal. Since line B represents a system utilizing maximum slope control (e.g., maximum reduction in the slope above the threshold compared to an uncontrolled system), the maximum line output level is essentially constant (or changes only slightly) for line input levels above the threshold B'. Moreover, in this illustrated embodiment, as the level of output slope control is increased, the system's response (i.e., recovery/decay) time increases so that rapid reductions in line input levels do not create silent periods or loss of signal. However, the system handles large increases in the magnitude of the line input levels with fast attack times to prevent loud noises or clipping during these rapid increases in line input levels. Thus, when the maximum amount of output slope control is applied, loud sound signals (i.e., large line input levels) will not produce outputs above a predetermined maximum line output level.

Line C illustrates the curve for a system that is using a level of output slope control that is in the mid-range between maximum and no output slope control. Like in curve B, curve C has a control point or threshold C' at the knee of the curve C, where the maximum line output level transitions from being proportional to the maximum line input level to a function of the maximum line input level and the output slope control signal. This scenario represents the situation where the user desires some output variation from loud sound signals (i.e., maximum line inputs), but not the unlimited levels found in uncontrolled systems. Thus, the maximum output volume is limited to the value along the slope of line c, rather than a substantially fixed value, as shown for line B. Moreover, since the amount of output slope control is in the mid-range, the response time to changes in the line input levels is between the instantaneous response when no output slope control is used and the slower response when full output slope control is used.

Another aspect of the present invention is illustrated by the intersection D (contained in the dashed circle) of curves A, B, and C. The curves are produced to intersect at point D, which is where the average maximum line input level is anticipated to occur. Thus, regardless of the amount of the output slope control applied to the system (except zero), the average maximum line input level will always produce approximately the same maximum line output level (or output volume) at the anticipated mid-range. To achieve the intersection at point D, the thresholds B' and C' must be placed at a position on the curves that will assure intersection at the region D for the controlled portion of curves B and C. Therefore, as more output slope control is applied, the portion of the curves below the threshold have a steeper slope in which the output is proportional to the input when no control is applied, and the threshold (or control point) is placed at a higher line output level and a lower line input level for different amounts of output slope control. Thus, each output control slope intersects at approximately the anticipated mid-range value of the line input signal, which as illustrated in FIG. 7 occurs at approximately 300 mV (although other intersection values may be used).

FIG. 1 shows a perspective view a sound leveling system 10 in accordance with a first embodiment of the present invention. The sound leveling system includes a chassis housing 12, housing feet 14 and a face plate 16. The chassis housing 12 is supported by the housing feet 14 and contains the sound leveling system electronics and connectors for coupling the sound leveling system 10 to one or more television sets and one or more speaker and/or line outputs.

The interface between the user and the sound leveling system includes a power switch 18, a output slope control 20, a volume control 22, a balance control 24, a display 26, and an override switch 28. The user activates the sound leveling system 10 by the power switch 18. In preferred embodiments, power to the sound leveling system 10 is supplied by an external AC-to-DC power adapter plugged into a standard 120 V AC house outlet. However, in other embodiments, the power may be supplied by an internal AC to DC converter, battery or the like.

The amount of output slope control, volume and balance are controlled by the user manipulating and setting the respective controls 20, 22, and 24. In preferred embodiments, the controls 20, 22 and 24 are slidable potentiometers. In alternative embodiments, the controls may be knobs, matched pairs of up and down buttons for each control, or keypad controls interfaced with a microprocessor or the like. The display 26 is illustrated as a 10 LED display which displays the amount of output slope control being used by the sound leveling system 10.

The override switch 28 can be used by the user to manually set the sound leveling system 10 to utilize the maximum amount of output slope control and set the maximum output level, regardless of the position of the output slope control 20. In preferred embodiments, the override switch 28 (or supervisory control) requires a special tool, such as a double diamond screw driver or the like to activate the switch 28. However, in alternative embodiments, the override switching and maximum volume level may be controlled with a special code inputted to an internal microprocessor or the like. The override switch 28 affects only speaker outputs 112 and 114 in this embodiment.

Figure 2:
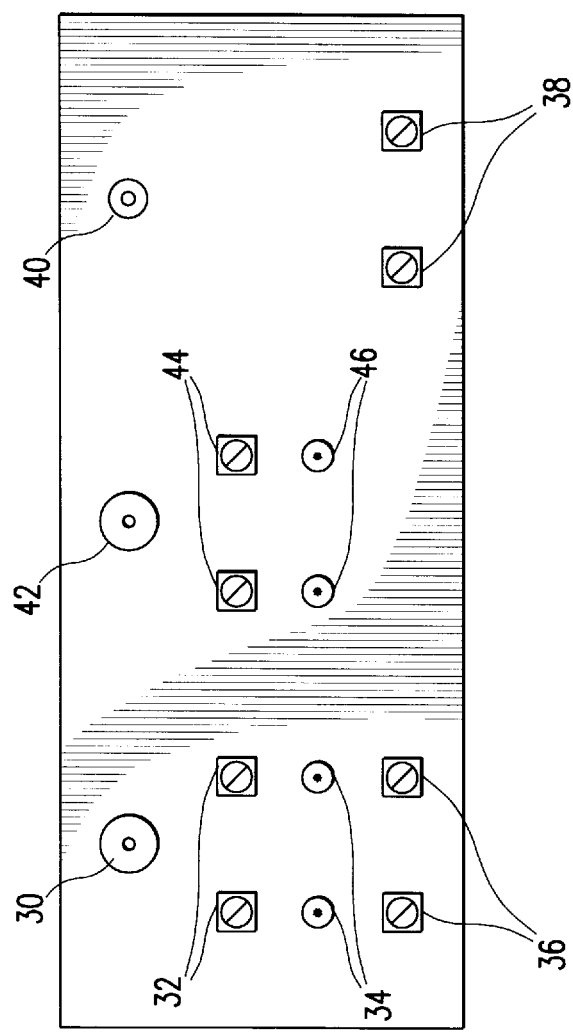
FIG. 2 is a rear view of the embodiment shown in FIG. 1.

FIG. 2, shows a rear view of the chassis 12 of the sound leveling system 10. The sound leveling system 10 accepts inputs from a television or stereo though either a 75Ω coaxial/triaxial connector 30, a pair of standard two input contacts 32, or a pair of 600 ohm line inputs 34. The output of the sound leveling system 10 is sent to speakers or other audio components through either a pair of speaker outputs 36 or a pair of line outputs 38. The power is supplied to the sound leveling system 10 via a power adapter jack 40. In preferred embodiments, the sound leveling system has a second set of input jacks 42, 44 and 46 to provide the capability for the sound leveling system to receive inputs from a second TV set, stereo, mono sound system or the like. In such an embodiment, the set (i.e., input source) with the strongest signal (i.e., volume) will be dominate the output and the ratio of the input amplitudes between the two sources will be preserved. Thus, a user can listen to one input or the other simply by increasing or decreasing the volume of one TV or stereo relative to the other, while the total output volume remains substantially fixed.

Figure 3:
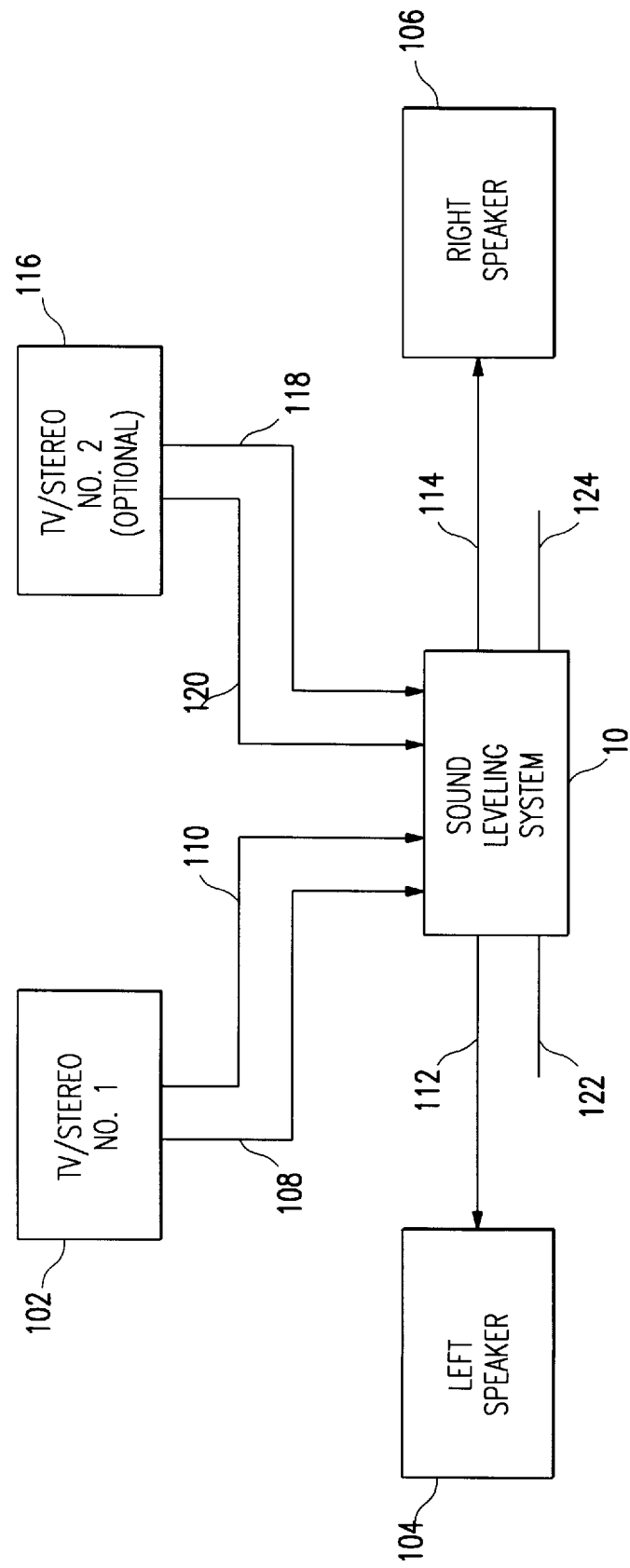
FIG. 3 is a simplified system block diagram of the sound leveling system shown in FIGS. 1 and 2 coupled to other components.

FIG. 3 shows a simplified block diagram of the embodiment illustrated in FIGS. 1 and 2. The sound leveling system 10 is coupled to a first TV or stereo 102, a left speaker 104 and a right speaker 106. The TV 102 is coupled to the sound leveling system 10 through lines 108 and 110, which represent the left and right channels of the audio signal. The lines 108 and 110 may be individual separate lines or a signal passed through a single triaxial cable or the like. The left speaker 104 is coupled to the sound leveling system 10 via line 112, and the right speaker 106 is coupled via line 114. The sound leveling system may be coupled to a second TV or stereo 116 via lines 118 and 120. Instead of speakers 104 and 106, the sound leveling system may be coupled to a sound system (not shown) via line outputs 122 and 124. The difference between the "speaker output" lines 112 and 114, and the "line output" lines 122 and 124 is that the "line output" produce a lower amplitude signal (typically 1 volt at 600 ohms). These lower amplitude signals are usually applied to the inputs of stereo sound amplifier systems, recorders or other external sound systems such as computer sound cards, or the like. In the detailed schematics, described below, the volume and balance controls only affect the volume of the internal speaker power amplifier on lines 112 and 114, not the output lines 122 and 124.

Figure 4:
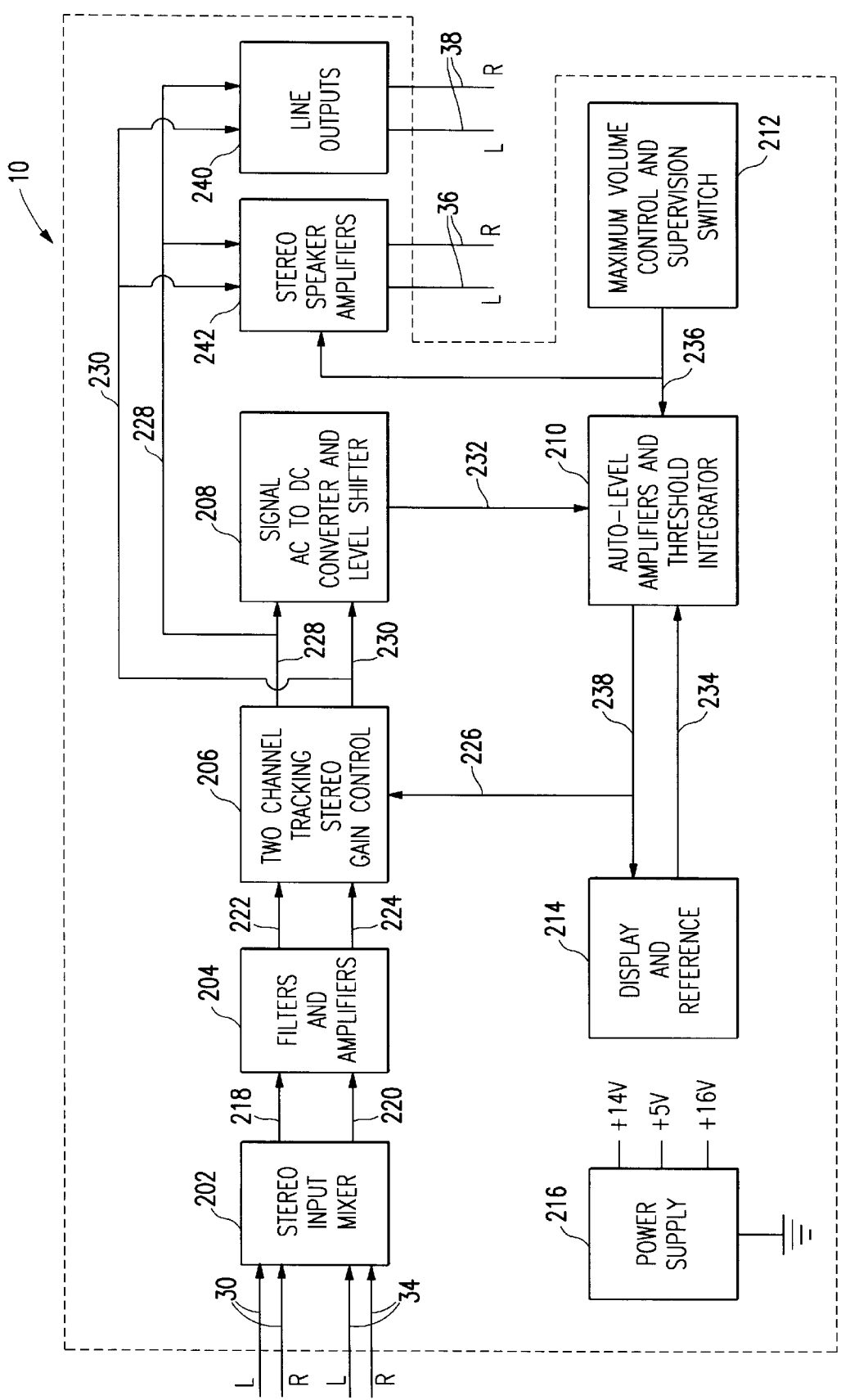
FIG. 4 is a simplified functional block diagram for the sound leveling system embodiment shown in FIGS. 1–3.

FIG. 4 is a simplified functional block diagram of the sound leveling system 10 illustrated in FIGS. 1–3. The sound leveling system 10 includes a stereo input mixer 202, a filters and amplifiers section 204, a two channel tracking stereo gain control section 206, an AC-to-DC signal convertor and level shifter 208, an auto-level amplifiers and threshold integrator 210, an override switch 212, and a display and reference section 214.

The stereo input mixer 202 is coupled to the television or stereo 102 and/or 116 (see FIG. 3) through inputs 30 (or 32, 42 or 44) on the back of the sound leveling system 10 or through line inputs 34 (or 46) on the back of sound leveling system 10 (see FIG. 2). The stereo input mixer 202 adds the left and right signal channels from each stereo source 102 and/or 116, and passes each resulting signal through a low pass filter to remove high frequency artifacts above the audio spectrum in the signals. The output of the stereo input mixer 202 is coupled to the audio bandpass filters and amplifiers section module 204 through lines 218 and 220 representing the mixed right and left channel signals, respectively.

The filters and amplifiers section 204 performs further low pass filtering of the signal, high pass filtering of the signal to remove DC signal components, and then amplifies the signal on lines 218 and 220 to make up for any attenuation caused by the stereo input mixer 202. The output of the filters and amplifiers section 204 is coupled to the two channel tracking stereo gain control 206 through lines 222 and 224 representing the right and left channel signals, respectively.

The input to the two channel tracking stereo gain control 206 on line 222 is passed non-inverted to one amplifier, while the input on line 224 is passed inverted to another amplifier in the stereo gain control section 206. Using an inverted and non-inverted signal facilitates quasi-full-wave AC-to-DC conversion (later on in the circuit) of the normal in phase voice portions of the stereo material. A control signal used to adjust the two signals on lines 222 and 224 is provided by control line 226 from the auto-level amplifiers and threshold integrator 210. In preferred embodiments, the control signal on line 226 causes the gain in each channel ranges from a high of 50 to a low of 0.02 (e.g., a ratio of 2500:1), although in other embodiments different gain ranges may be used. The output of the two channel tracking stereo gain control 206 is coupled to the signal AC-to-DC converter and level shifter 208 through lines 228 and 230 representing the right and left channels, respectively.

The linear signal AC-to-DC converter and level shifter 208 rectifies the AC components of the signals on lines 228 and 230 after they have been passed through a high pass filter to remove the DC components. This allows the signals in the frequency range predominated by voice energy and low frequency percussion signals to dominate the gain control function. The two signal channels on lines 228 and 230 are "rectified," summed, and filtered to produce a single DC control signal that represents the phase independent sum of the two channels in line 232. Once the signal is rectified, a nominal gain is applied to the rectified signal which is then output to the auto-level amplifiers and threshold integrator 210 through line 232.

The auto-level amplifiers and threshold integrator 210 receives and uses the peaks of the signal (i.e., the maximum line inputs) on line 232 from the signal convertor 208. The average of the time weighted peaks are used to determine the amount of gain to be applied by the two channel tracking stereo gain control 206 to the signals received on lines 222 and 224. Thus, the control signal determines the gain, which limits the amount of energy output by the speaker outputs 36 or line outputs 38 of the sound leveling system 10. To set the control signal, the auto-level amplifier and threshold integrator 210 uses a reference voltage on line 234 from the display and reference module 214. The reference voltage on line 234 is utilized to set the threshold and slope amplifier inputs, and thus aid in altering the control signal to correspond to the required change in the amount of output slope control set by the output slope control 20 and the volume control 22 (see FIG. 1). The amount of output slope control can be set and locked at a maximum output slope control value by using the override switch 212 which is coupled to the auto-level amplifiers and threshold integrator 210 by a mechanical linkage 236, such as a switch, potentiometer, cable activated switch or the like. The output of the auto-level amplifiers and threshold integrator 210 is coupled to the two-channel-tracking-stereo-gain-control 206 by line 226 to close the control loop for the sound leveling system 10, and to the display and reference section 214 by line 238.

The display and reference section 214 produces a visual display of the amount of output control applied to the input signals. The display aids the user in adjusting the level of output slope control to a desired level by providing a visual indication of the change in the level of output slope control. In preferred embodiments, the display is made up of elements, such as LEDs and the like, to provide a logarithmic bar graph display of the level of output control (shown at 26 in FIG. 1). However, in alternative embodiments, LCD displays may be used, and other pattern arrangements of the elements may be used. In other embodiments, a two color LED display device is used. The display and reference section 214 also provides the auto level amplifiers and threshold integrator 210 with a reference voltage on line 234 used to set thresholds and adjust the control signal produced in the auto level amplifiers and threshold integrator 210.

The sound leveling system 10 is powered by the power supply 216. In preferred embodiments, the power supply 216 receives 120 V 60 hz AC from a standard wall receptacle and converts this voltage to +16 volts DC. The power supply filters and supplies output power at +16 V, +14 V and +5 V levels. The +5 V level is used as a virtual floating ground in the various circuit components to avoid negative voltages. The +14 V level is used to supply positive power to the various circuit components, and the +16 V level is used to drive the power amplifiers in the stereo speaker output section of the sound leveling system 10. In alternative embodiments, the power supply 216 may use batteries or convert the input voltage to different DC levels.

A line output section 240 and a stereo speaker amplifier section 242 are also connected to output lines 228 and 230 from the two channel tracking stereo gain control 206. The line output section 240 produces a 600Ω output signal on line outputs 38 for use by various external stereo or television power amplifiers. The output signal on the line outputs 38 is only modified by the output slope control, while the speaker related gain and adjustment effects are not present in the output signal. The stereo speaker amplifier section 206 produces an 8–16Ω output signal at the speaker outputs 36. This output signal has typical speaker controls for level and balance, as well as output slope control and a supervisory control applied to the output signal at speaker outputs 36. In preferred embodiments, the line outputs 38 or the speaker outputs 36 are coupled to other components or speakers through wires or cables. However, in alternative embodiments, the line outputs 38 and the speaker outputs 36 may be coupled by wireless transmission devices using infrared, radio waves or the like.

FIGS. 5(a)–5(d) illustrate a detailed schematic diagram of one preferred embodiment of the sound leveling system 10 shown in FIGS. 1–4. Each component is numbered and its corresponding value is identified on the drawings. However, it should be understood that different circuit arrangements may be used to produce the same results as the disclosed circuit. For example, a microprocessor could be programmed to perform many of the functions of the individual components, or a customized chip application specific integrated circuit (ASIC) could be manufactured rather than using individual discrete components.

Figure 5A:
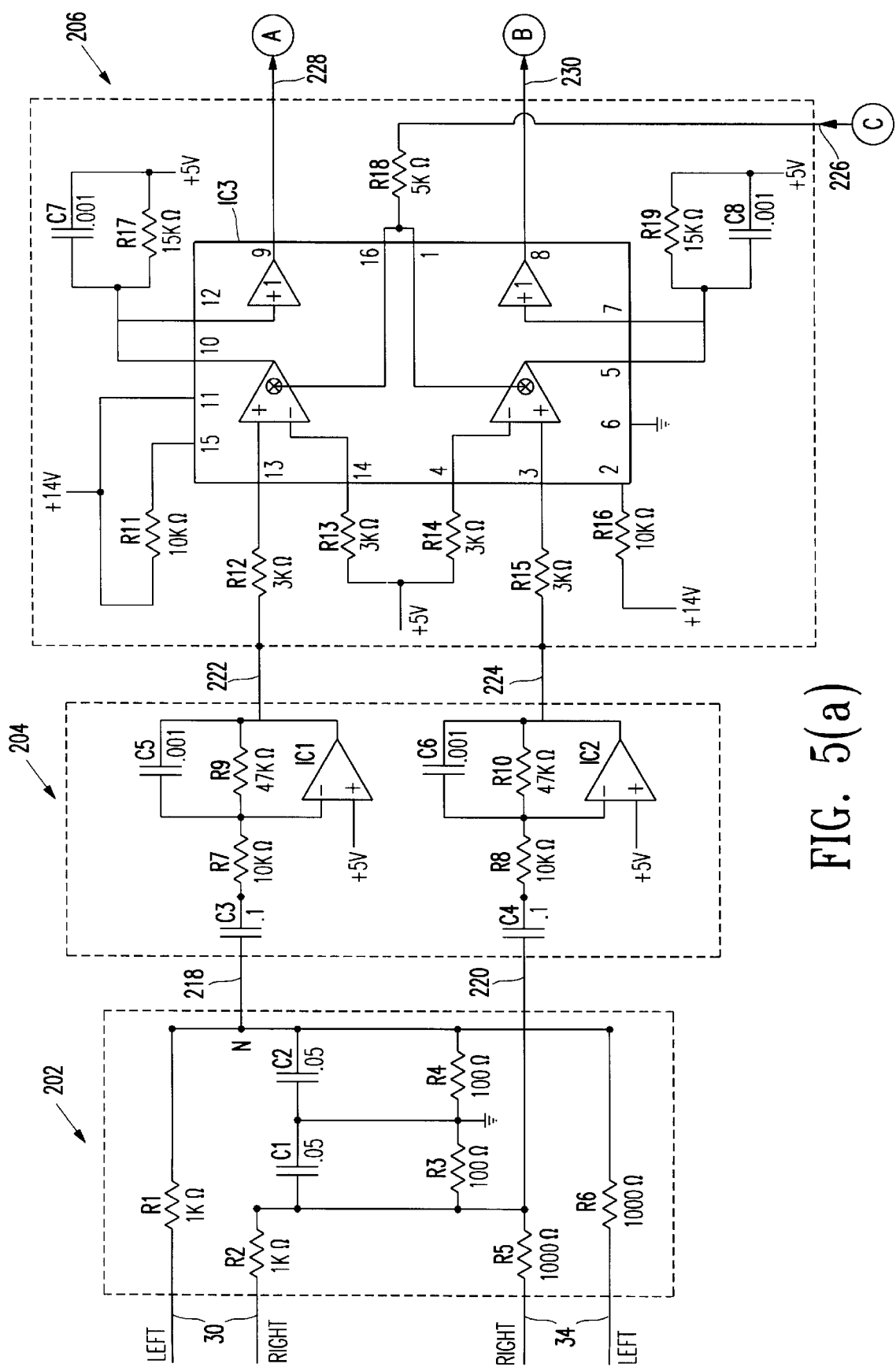
FIG. 5 is a detailed schematic diagram of a preferred embodiment of the sound leveling system shown in FIG. 4.

FIG. 5(a) illustrates a detailed circuit diagram for the stereo input mixer 202, the filters and amplifiers section 204 and the two channel tracking stereo gain control 206. The stereo input mixer 202 receives line or speaker inputs from the inputs 30 (or 32, 44 or 46) and line inputs from the inputs 34 (or 46) on the back of the sound leveling system 10 (see FIG. 2). The stereo input mixer 202 also uses capacitors C1 and C2 to form a first low pass filter to remove the high frequency artifacts associated with stereo demodulation and other supersonic noises. These artifacts are removed, because high frequency artifacts, if present, could influence the gain control function such that the gain of the sound leveling systems would be partially dependent on these artifacts and not just the components of the received stereo signal. In alternative embodiments, other mixer methods such as transformers and active IC mixers may be used.

The filters and amplifiers section 204 is coupled to the stereo input mixer 202 by lines 218 and 220. The signal on line 218 passes through an active audio band pass filter formed by capacitor C3 and resistor R7 to high pass filter the low end of the audio band pass, while resistor R9, capacitor C5, and operational amplifier IC1 form a filter to roll off the high end of the audio spectrum. The gain of the operational amplifier IC1 is set to a mid-range value by the ratio of resistor R7 to resistor R9. Using this gain makes up for the losses in the input mixer 202 and provides additional filtering that removes noise from line sources. The other channel signal on line 220 is handled in a similar manner. In preferred embodiments, the operational amplifiers IC1 and IC2 are a dual operational amplifier type TS572CN manufactured by Thompson CSF, Inc. However, in alternative embodiments, other operational amplifiers with low input offset and wide bandwidth may be used.

The two-channel-tracking-stereo-gain-control 206 is directly coupled to the filters and amplifiers section 204 by lines 222 and 224. In preferred embodiments, the two channel tracking stereo gain control 206 uses an IC3 that is a dual transconductance amplifier chip, such as an LM13600 manufactured by several sources (or an XR13600 manufactured by EXAR Corp.). The gain of the two amplifiers in IC3 are controlled by a current signal on line 226 from the auto-level amplifiers and threshold integrator 210 described below. In preferred embodiments, a voltage gain of 50 above each line 222 and 224 (i.e., in each channel) is produced when line 226 is at maximum current (e.g., approximately 2 mA), and a gain 0.02 is produced when the current on line 226 is very small (e.g., approximately 0.1 mA). This provides the sound leveling system 10 with a gain range of approximately 2500:1 (i.e., 50÷0.02). The gain control current is provided by a voltage on line 226 through resistor R18, and is equally shared by the transconductance control pins 1 and 16 of IC3. This gain is approximately logarithmic with current (e.g., with the voltage on line 226) and is matched in each channel. In particular embodiments, only a portion of the available gain range is utilized, and in alternative embodiments different minimum and maximum gains may be produced or required.

The input on line 222 is fed into an inverting input of an amplifier in the IC3, while the input on line 224 is fed into a non-inverting input of another amplifier in the IC3 to facilitate full wave AC-to-DC conversion of the usually in phase voice portions and most low frequency components of the stereo signals. Resistors R12–R15 are matched and have a low ohmic value to provide a high current output for high gain conversion of the voltage on the lines 222 and 224 that are applied to the IC3. Moreover, Resistors R11 and R16 are matched to provide a required linearizing current source in the range of 1.0 mA. Likewise, the outputs use matched resistors R17 and R19 which are shunted by capacitors C7 and C8 to provide additional low pass filtering of the signals on lines 222 and 224 and to further remove any spurious noise due to the stereo sources. The resistors R17 and R19 are isolated by an internal unity gain buffer amplifier. These internal buffer amplifiers produce the outputs on lines 228 and 230, which then supply the signals to the "line output" network 240, the power amplifier 242, and the two channel AC-to-DC convertor 208. In IC3, current through R12 (and R15) into IC3 at pin 13 (and 3) produces a current in resistor R17 (and R19), which is converted to a voltage across resistor R17 (and R19) and buffered by the internal buffers at pin 9 (and 8). Thus, the two channel tracking and stereo gain control 206 provides gain control, two channel gain tracking, and buffering that is used to drive sections 208, 240 and 242 by lines 228 and 230.

Figure 5B:
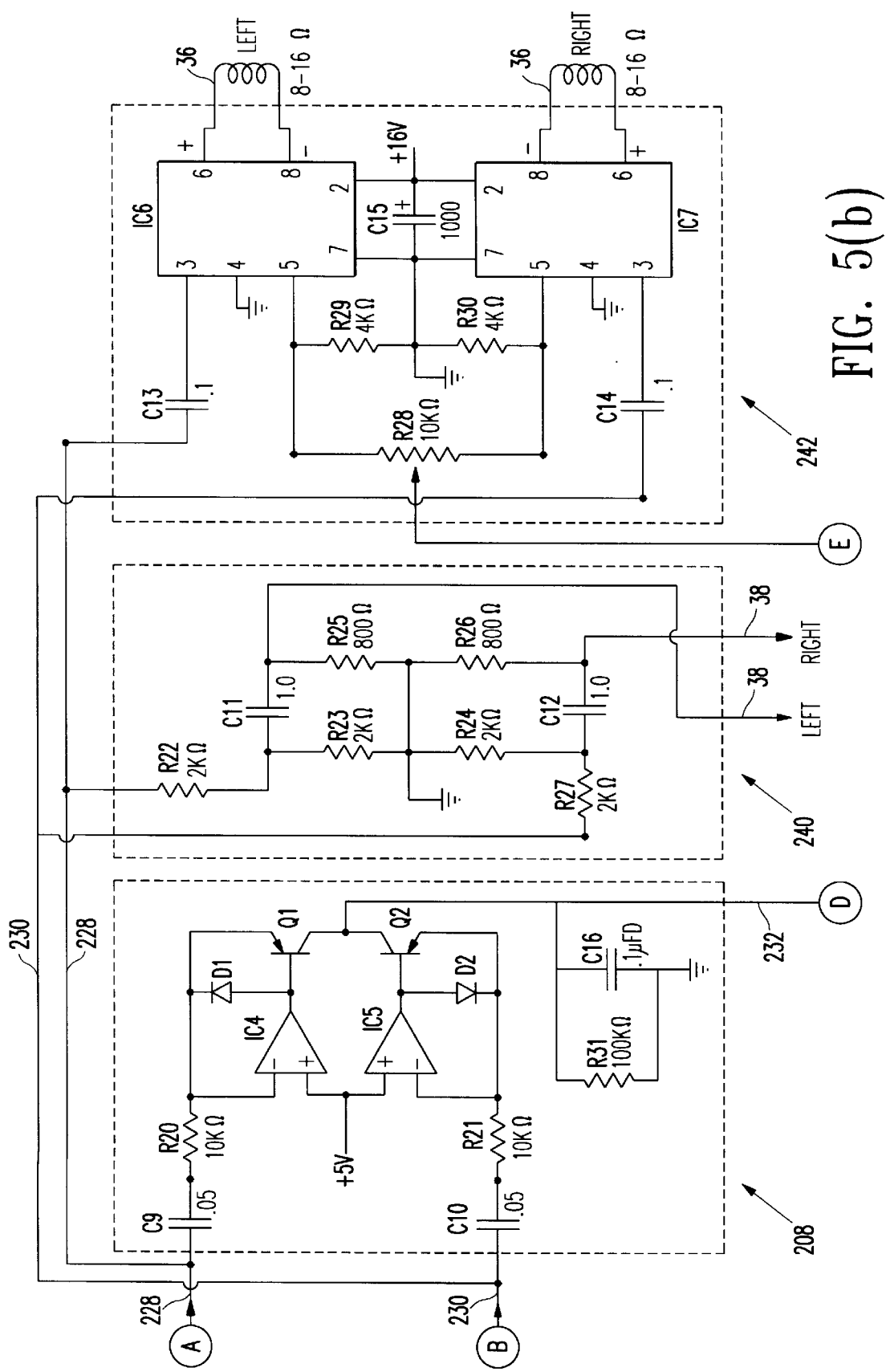

FIG. 5(b) illustrates a detailed circuit for the AC-to-DC converter and level shifter 208. This replaces the usual "signal rectifier" used in typical prior art systems. The signal on line 228 is input into the summing node of an operational amplifier IC4 through resistor R20 and capacitor C9 in the AC-to-DC converter and level shifter 208. The function of section 208 is to produce a voltage used by the auto-level amplifiers and threshold integrator 210 to control the level of the output signals on lines 228 and 230 through the loop including the two channel tracking stereo gain control 206. The resistor R20 and capacitor C9 form a high pass filter having a 3 db point of approximately 250 Hz (although other frequencies may be used) to substantially eliminate low frequency and DC components in the signal from being converted to DC and ultimately applied to the two channel tracking stereo gain control 206. The resulting DC signal produced at the collectors of the two transistors Q1 and Q2 on line 232 is thus dominated by the voice power energy and the low frequency percussion signals present in the signal received on lines 228 and 230. Only the positive half of the input signal applied to the operational amplifier IC4 appears from the collector of Q1 on line 232, since the diode D1 shunts out the negative half of the wave to maintain a zero node at the inverting node of the operational amplifier IC4. The ratio between resistor 20 and resistor 31 (i.e., 10K:100K) set the gain to multiply the ½ wave voltage on line 228 by a factor of approximately 10. The other channel signal on line 230 is handled in a similar manner.

The resistor R31 is shunted by capacitor C16 to provide an averaging time of approximately 10 milliseconds (although longer or shorter times may be used). To understand how this happens, assume there is a 0.1 volt peak-to-peak signal on line 228 at 1000 Hz. This results in ±0.01 mA (0.1 volts÷10 kΩ) current at the summing node (i.e., the negative input) of IC4. A current of an equal and opposite polarity is driven by the output of IC4 through either the emitter of transistor Q1 or the diode D1. The emitter current from transistor Q1 is in the form of negative ½ wave 0.01 mA peak pulses, and the collector current from transistor Q1 is approximately equal, but opposite in polarity to the current in the emitter of Q1. This results in positive ½ wave pulses of +0.01 mA through the resistor R31 which (without capacitor C16) would produce a voltage of 1.0 volts peak. The other channel signal on line 230 produces a similar signal. If the other channel signal on line 230 is 180° out of phase, then the signal across resistor R31 would resemble a full wave rectified signal having an average value of (0.64× 1.0 volt) 0.64 volts. The capacitor C16 provides the averaging so that the resultant output signal is independent of the input phases of the signal, with any noise spikes that might occur being absorbed by the averaging process. Although averaging is preferred for most signals, peak detection and peak detector circuits may be used in alternative embodiments.

Unlike typical prior art systems which provide a 0.6 volt threshold from a rectifier diode, this illustrated active rectifier provides linear conversion and gain from millivolts to volts. This is important because it provides the system with the capability to operate with low level inputs, and over a wide phase independent linear dynamic summing range for the 2 input channels. In preferred embodiments, the operational amplifiers IC4 and IC5 are identical to IC1, IC2. However, in alternative embodiments, other amplifiers or signal rectifiers may be used. For example, FIG. 6 is a detailed schematic of an alternative embodiment of a AC-to-DC converter and level shifter 208' that can be used in the sound leveling system shown in FIGS. 5(a)–5(d). This rectifier uses four operational amplifiers IC101–IC104 to full wave convert each AC input signal to a single DC signal, where the wave shape of the inputs require this.

Figure 5C:
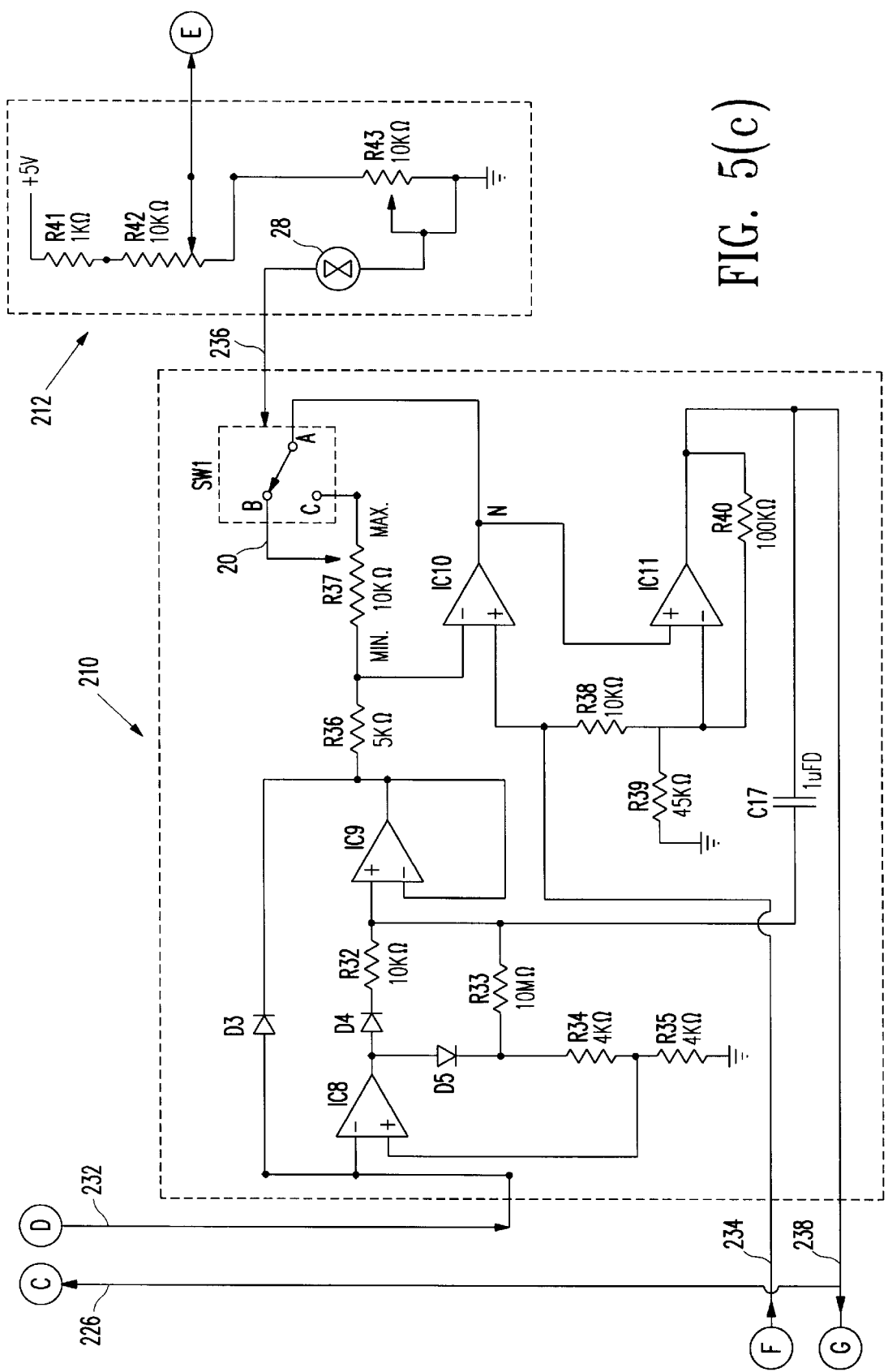
Figure 6:
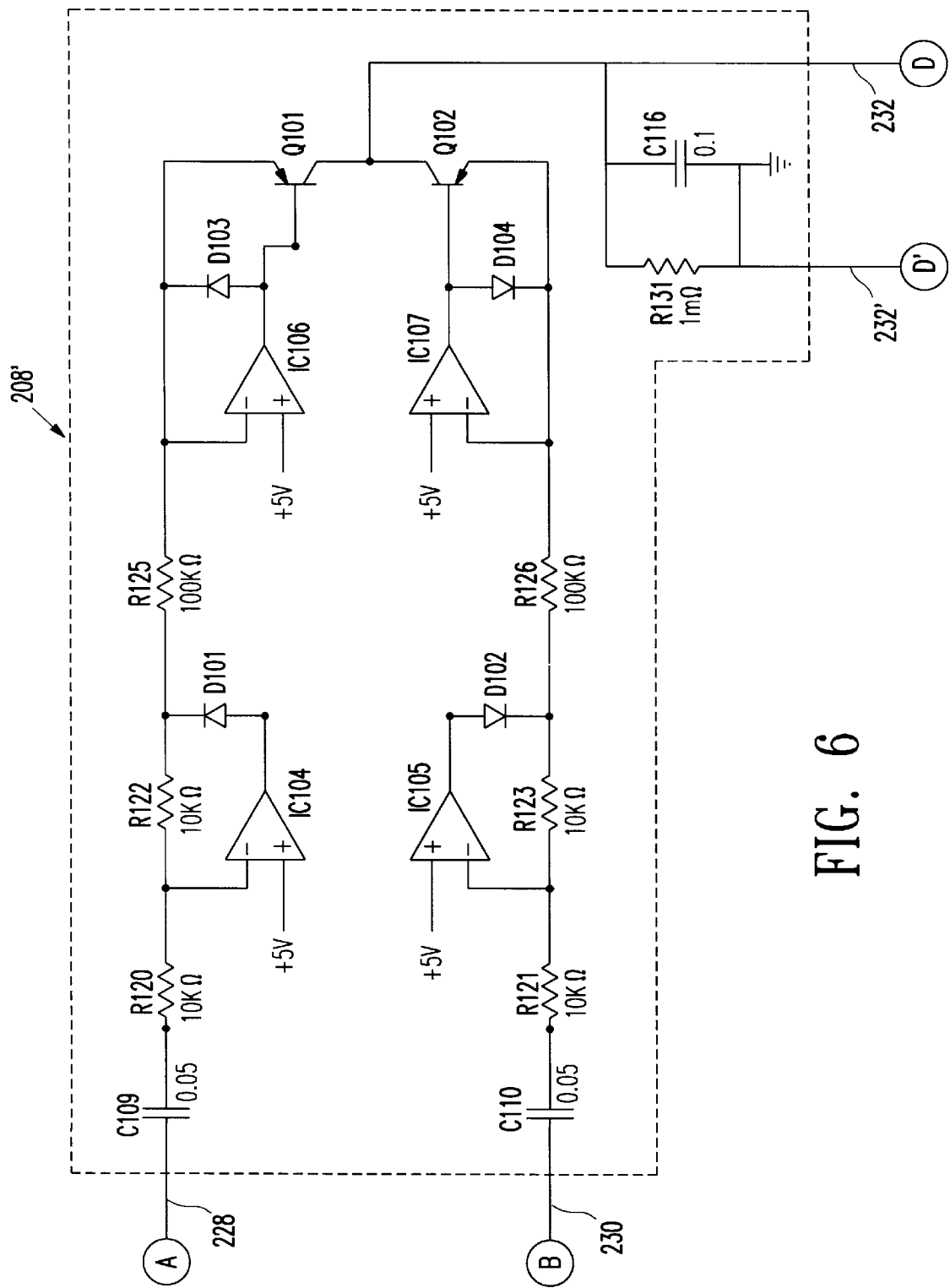
FIG. 6 is a detailed schematic diagram of an alternative embodiment of a AC-to-DC converter and level shifter that can be used in the sound leveling system shown in FIGS. 5(a)–5(d).

FIG. 5(c) illustrates a detailed circuit schematic of the auto-level amplifiers and threshold integrator 210 and the override switch 212. The auto-level amplifiers and threshold integrator 210 is coupled to the AC-to-DC converter and level shifter 208 by line 232. The peaks of the signal on line 232 are applied to the operational amplifier IC8 which utilizes a nominal gain of 2 set by resistors R34 and R35 (although other gains which affect the peak-rate-limiter-diode D3 may be used). Diode D4, resistor R32 and capacitor C17 form a positive signal "attack time" integrator of the control voltage (i.e., a negative going output), when the voltage from operational amplifier IC9 is above the reference voltage on line 234. Operational amplifiers IC9–11 are coupled together and form the integrator feedback loop including capacitor C17. The "recovery time" is set via a feedback loop passing through resistor R33, which can be many times larger than R32 (although both resistors may be variable). The "attack time" is the time required for a step input amplitude increase to be reduced to a fixed level at the output of the integrator. "Recovery time" is for a step input decrease to be increased to a fixed level at the output of the integrator.

Peak rate limiting (e.g., the peak rate of gain change in the system) is enabled by adding diode D3. For instance, as the magnitude of the input signal on line 232 increases, the signal is held to the gain of operational amplifier IC8 and the rate of increase in the magnitude is controlled by the operational amplifier IC9 and the threshold of diode D4. This circuit arrangement prevents an input delta function (i.e., an amplitude increase that is large and fast) on line 232 from overshooting into a silent (i.e., saturation) region following a large input signal level increase, since the allowed rate of increase from operational amplifier IC9 and the threshold of diode D4 are independent of the magnitude of the signal on line 232.

Figure 8B:
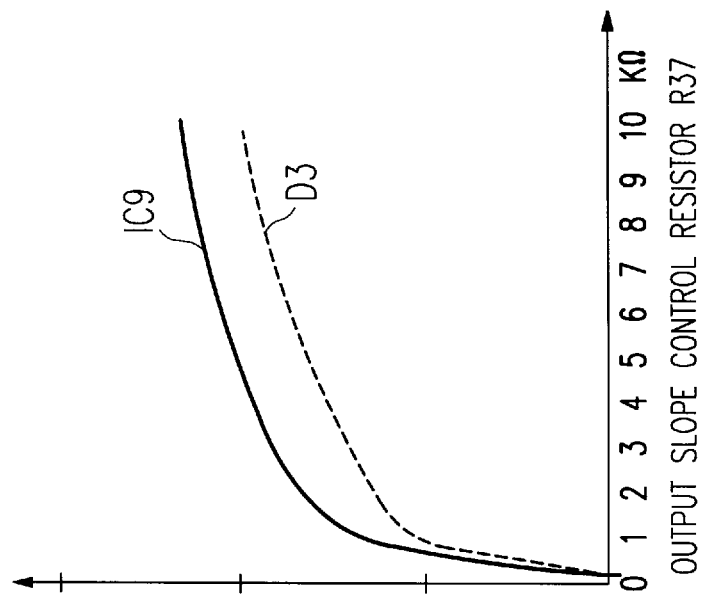
FIG. 8 is graphs depicting the operation of the circuits shown in FIGS. 5(a)–5(d).
Figure 8A:
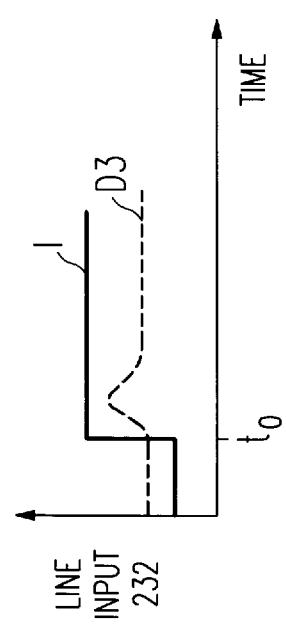

This can best be understood from FIGS. 8(a)–8(d) which describe the operation of the integrator loop and peak rate limiter contained in section 210. FIG. 8(a) illustrates how the system responds to a large step input at time $t_0$. As the input I steps up, the diode D3 in the peak limiter portion of the integrator prevents the output from the integrator from suddenly spiking up, which then allows the system to reduce the increase in the loop down to a fixed level. FIG. 8(b) shows that the effective threshold at the output of the operational amplifier IC9 is limited to the output of diode D3 (i.e., equal to the signal on line 232) plus the 0.6 offset voltage of diode D3 to prevent clipping.

Figure 8C:
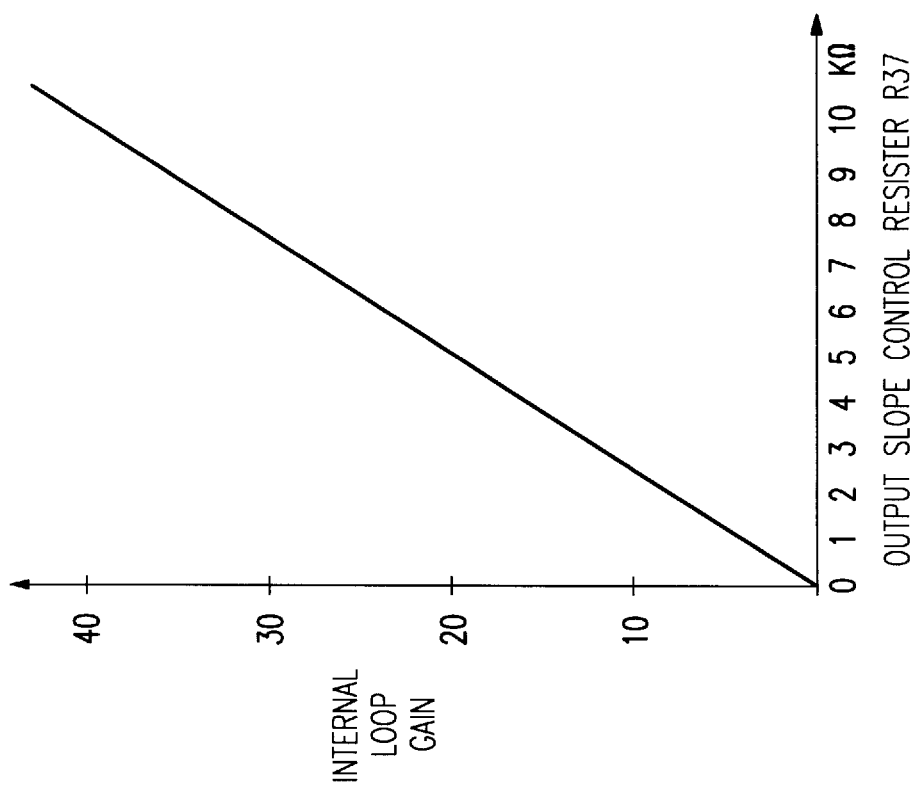

FIGS. 8(b) and 8(c) show that as the amount of slope control is decreased (i.e., as the resistance of resistor R37 is reduced) the threshold is reduced from maximum (i.e., FIG. 8(b)) and the gain is reduced (i.e., FIG. 8(c)) so that a faster loop response of the system is offset by a corresponding gain reduction of the voltage jump on line 232 from the level shifter 208. This aspect is important, because without peak limiting diode D3 in the loop integrator, a step input on line 232 would cause a charge to build up on capacitors C16 and C17, which would then reduce the gain in the loop to nearly zero when there is a large change in the signal on line 232. Large changes would create a silent period at the outputs of the sound leveling system until the charge on capacitor C17 could decay. The silent period effect is common to typical prior art automatic gain control (AGC) circuits. But, this effect is essentially eliminated in embodiments of the present invention by the use of diode D3, because diode D3 limits the rate of charging in capacitor C17. Thus, the system gain is reduced slowly, but fast enough to react to changes, without undesirable silent periods. The illustrated embodiment has been shown with a diode D3 as a peak rate limiter on the input signal on line 232, where rate limiting is mainly controlled by the gain in IC8, and the attack time of the integrator input at the IC7 output and input. However, alternative embodiments may use different peak limiter circuits, microprocessors or the like to limit the peaks in the integrator loop that could cause silent periods or undesirable effects.

FIG. 8(c) shows the range of loop gains utilized by the integrators in the illustrated embodiments. Although not shown, it is important to note that as the gain increases, the response of the system becomes slower to prevent an over-shoot response of the system to large changes that can cause silent periods. In preferred embodiments, the response time is inversely proportional to the loop gain, and the response time is set by the charging time of capacitor C17. In alternative embodiments, different values for the capacitor C17 may be used. In still other embodiments, a plurality of capacitors C17 may be switched in so that the response time may be essentially constant regardless of the loop gain or may be used to allow the user to select a desired response time.

Figure 8D:
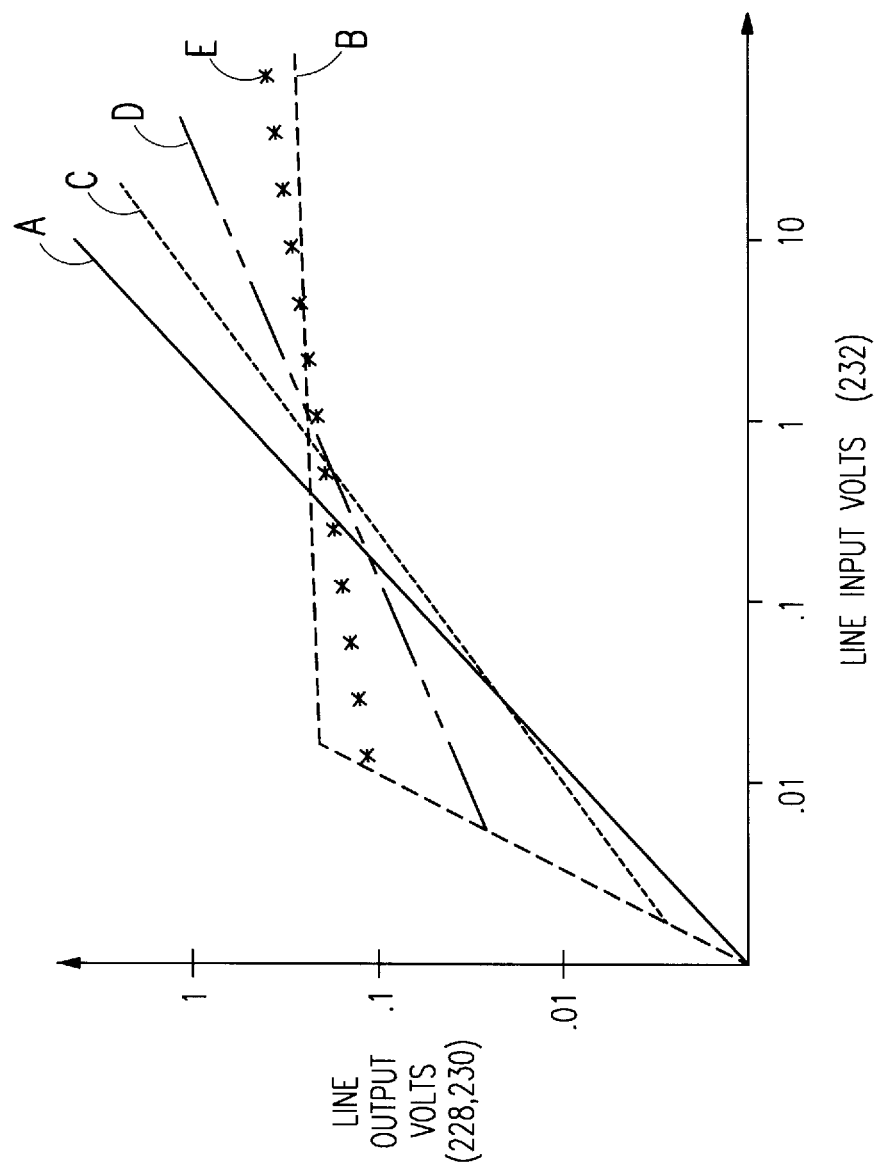

FIG. 8(d) is similar to FIG. 7 and shows how the thresholds and slopes of the output response curves change as a function of a change in the value of the output slope control resistor R37. Curve A illustrates the response of the system if no output slope control is utilized (i.e., resistor R37 is zero or bypassed). Curve B illustrates the response of the system when the maximum amount of slope control is applied (i.e., resistor R37 is at its maximum value of 10 KΩ). Curves C, D, and E illustrate the response of the system when various mid-range levels of output slope control are applied (i.e., resistor R37 has values of 5 KΩ, 1 KΩ and 0.5 KΩ, respectively). It should be understood that in alternative embodiments, resistor 37 may have different values or form different ratios then those illustrated in the detailed schematics.

The loop gain in the system is set from maximum to zero levels of output slope control by adjusting (from maximum to minimum) the effective resistance value of resistor R37 in the feedback loop of operational amplifier IC10. However, if the override switch 28 (supervisory control for maximum volume) in the override switch section 212 is activated (i.e., switch SW1 is connected from A to C in FIG. 5(c)), the maximum level of output slope control will be used and the effective value of resistor R37 will be 10 kΩ (although other resistance values may be used). The switch section 212 is normally in the non-active (i.e., the switch SW1 is connected from A to B) position when the override switch 28 through switch SW1 sets resistor R37 to the variable resistance position. In preferred embodiments, the override switch 28 is a switch/potentiometer combination arrangement, in which a small rotation past the minimum resistance value keeps the switch SW1 in the A to C position, so that the output slope control is at the maximum level, regardless of the position of the output slope control 20 on the sound leveling system 10.

The maximum output of resistor R42 in the override switch section 212 is controlled by resistor R43 which acts as a supervisory control. Any rotation of the override switch 28 toward a decreasing value switches resistor R37 in the auto-level amplifiers and threshold integrator 210 to its maximum output slope control value (i.e., the maximum resistance value) via a mechanical linkage that controls switch SW1. The switch SW1 provides the user with the capability to set the sound leveling system 10 to the maximum amount of output slope control, such that the output slope control 20 (see FIG. 1) will be inoperative. This can be used to prevent users, such as inmates or children, from operating the television or stereo above a predetermined output volume. The supervisory override switch 28 and maximum volume setting functions may require a special tool, such as a double diamond screw tip or the like, to rotate the override switch 28 to the override position that activates switch SW1.

The output slope control setting resistor R37 has a minimal effect on the allowed rate of increase in response, as long as the resistor R37 does not have a value near zero, since the level at the output of operational amplifier IC9 varies inversely (i.e., decreasing the threshold level) to the gain set for the operational amplifier IC9. Therefore, a change in the rate of increase is mutually offset by a change in the loop gain. This produces an effect that is easily observed in FIGS. 8(a)–8(d), as described above, where the actual output threshold is an inverse function of the output slope control gain.

This effect can be understood from observing the DC feedback from the operational amplifier IC11. Below the output threshold levels, the output of operational amplifier IC11 has a maximum DC output, which sets the voltage at the inverting input of the operational amplifier IC11 to a higher level than the voltage at the non-inverting input of operational amplifier IC11 received from the operational amplifier IC10. As the amount of output slope control is reduced by reducing the resistance value of resistor R37, the output from operational amplifier IC10 is converted to a less positive difference above the reference voltage on line 234 applied from the display and reference section 214. The smaller positive difference causes the output threshold to be reduced as the gain is lowered so that the output volume level for lower magnitude input signals is maintained (when input volume is in the expected mid-range). Without this effect, a change in the amount of output slope control (i.e., a change in the resistance value of resistor R37) applied to the signal would cause a correspondingly large change in the output volume. If this effect did not exist, additional control circuitry would be required to maintain the output volume. Resistor R39 partially controls this effect by setting the division at the minus input of operational amplifier IC11 to mismatch the reference voltage on line 234 or any portion above this. In preferred embodiments, the operational amplifiers IC8–IC11 are similar to IC1 and IC2 described above. This is further shown in FIGS. 7 and 8(a)–8(d). However, in alternative embodiments, other amplifiers may be used.

Figure 9:
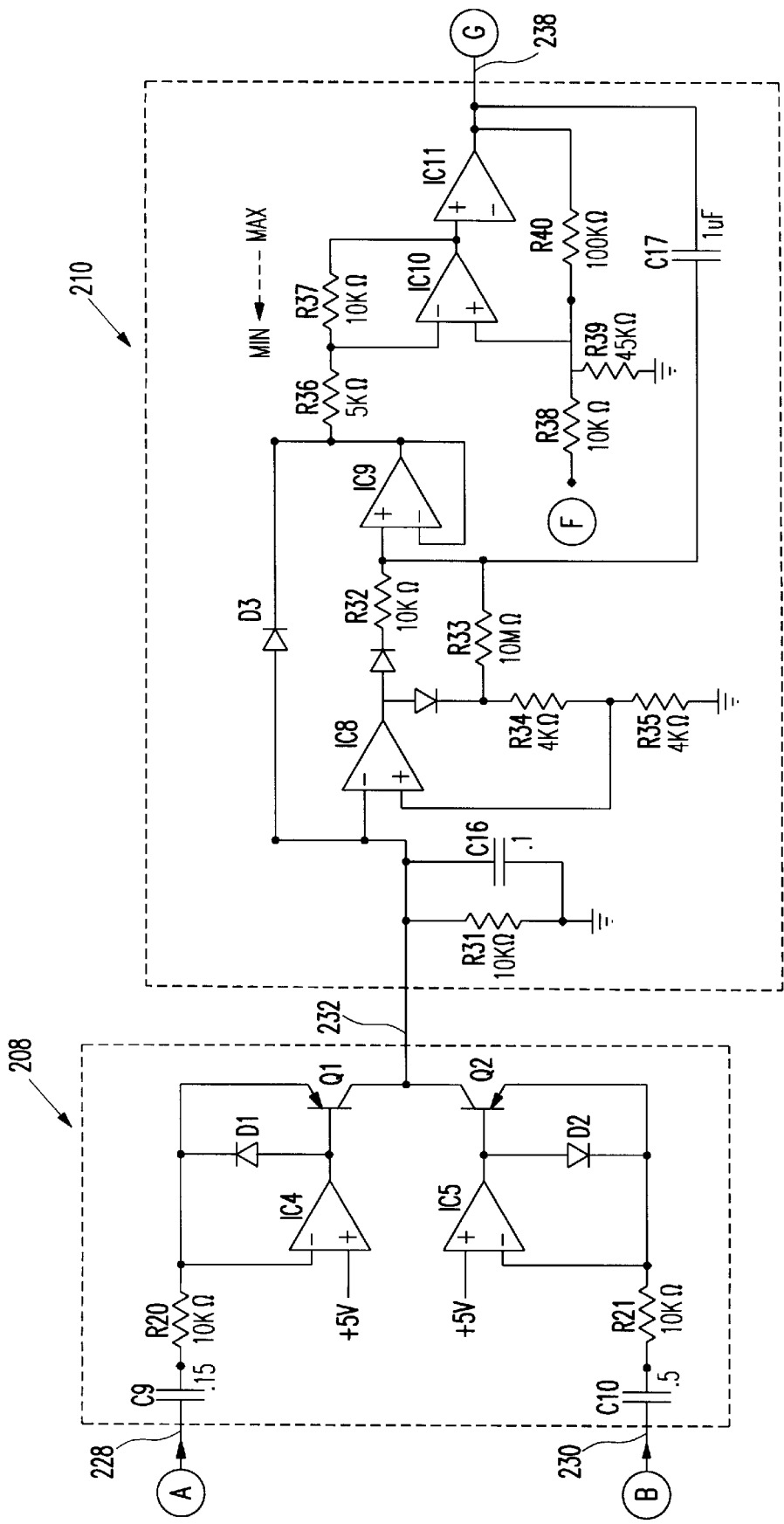
FIG. 9 is a simplified schematic diagram of a portion of the circuit shown in FIGS. 5(a)–5(d).

FIG. 9 is a schematic of a portion of the circuit shown in FIGS. 5(a)–5(d). In operation the operational amplifier IC4 converts the AC voltage across resistor R20 and capacitor C9 to a DC output on line 232. The DC voltage on line 232 is the average (typically over a 10 millisecond interval) of the AC input on line 228 times ½ the ratio of R31÷R20. If there are inputs on both lines 228 and 230, then the DC voltage on line 232 is the average of the signal on line 228 plus line 230 times the ratio of R31÷(R20×R21)/2. The operational amplifiers IC4 and IC5 are phase independent when producing the signal on line 232.

Figure 5D:
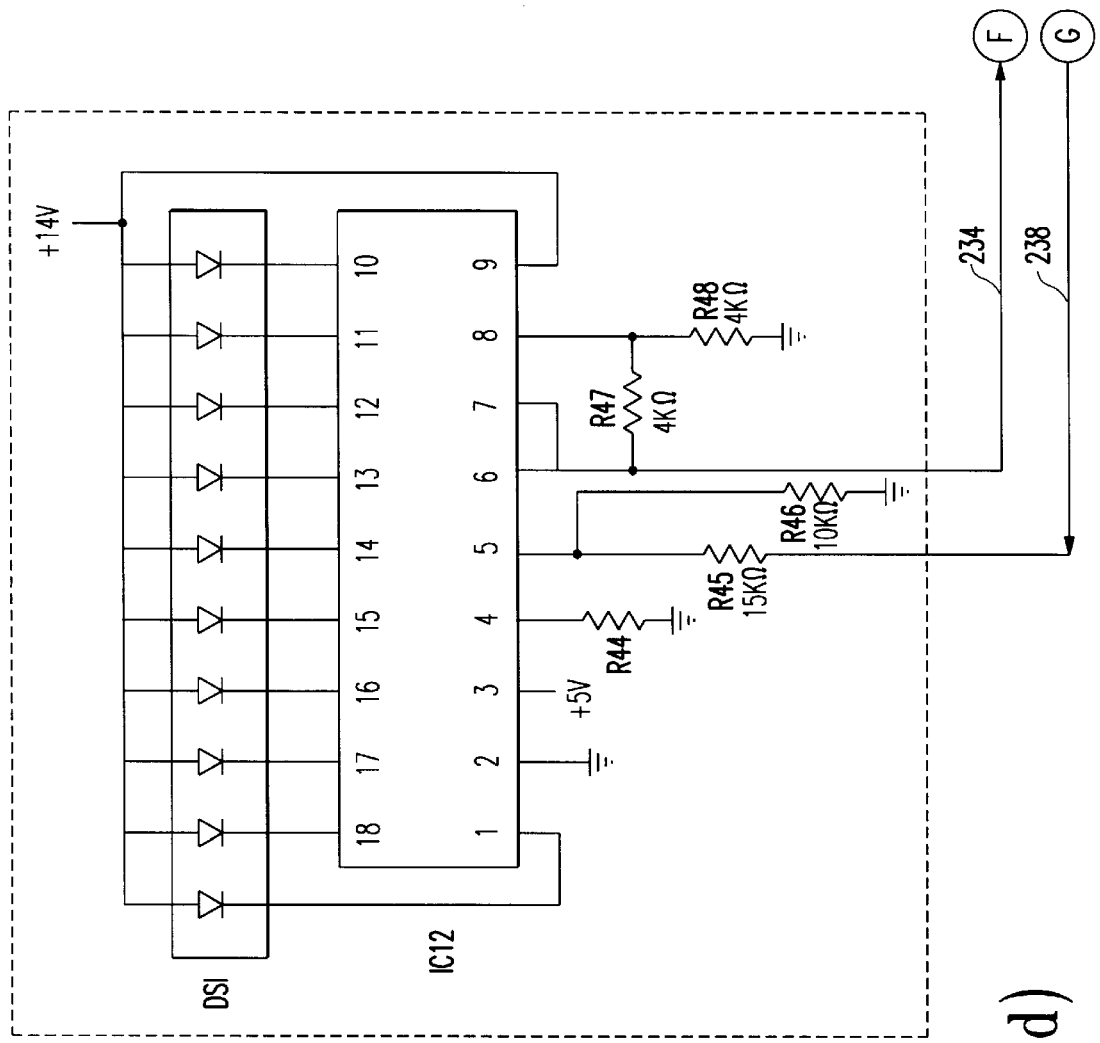
Figure 5D:
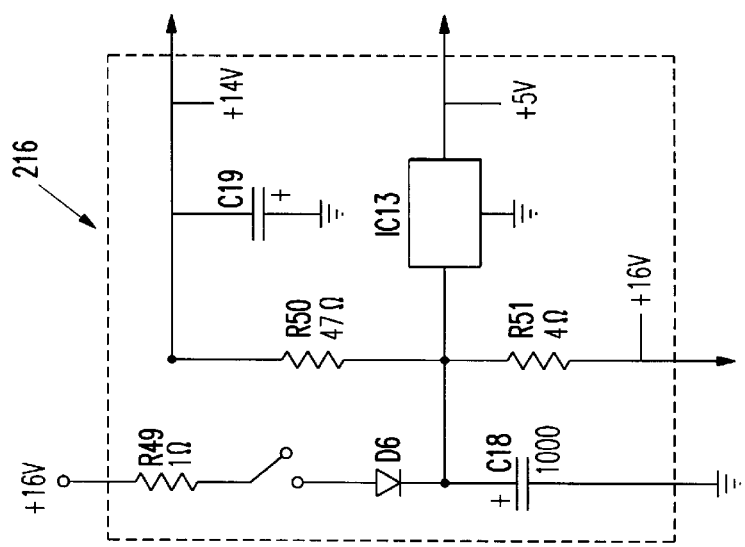

FIG. 5(d) illustrates a detailed circuit schematic of the display and reference section 214 and the power supply section 216. The display and reference section 214 uses a linear type LED driver IC12 of the type LM3915 manufactured by National Semiconductor, Inc. However, in alternative embodiments, other drivers or display devices may be used. The output on line 238 from the auto-level amplifiers and threshold integrator 210 is applied through a voltage divider to set the display range at pin 5. Resistors R47 and R48 set the internal sensing range for the display and generate-the reference voltage output on line 234 used by the auto-level amplifiers and threshold integrator 210. The display device IC12 is linear; however, the two-channel-tracking-stereo-gain-control 206 is logarithmic, and thus, the display device IC12 produces a log display of the amount of output slope control applied. In preferred embodiments, the number of illuminated LEDs decreases (to the right) as the input signal level increases.

In FIG. 5(d), the power supply section 216 receives +16 volts from an external AC-to-DC voltage convertor that is transformed isolated from the 120 V AC power line. This power supply module produces +16 V level (used to drive the speaker power amplifiers), +14 V level (used to power the ICs in the circuit) and +5 V level (used as a virtual floating ground).

FIG. 5(b) also illustrates a detailed circuit for the line output section 240 and the stereo speaker amplifier section 242. The line output section 240 is coupled to the two channel tracking stereo gain control 206 by lines 228 and 230. The line output section 240 produces left and right output signals on left and right output lines 38. The output signal is sized for a 600Ω stereo signal line, and the output signal only has the output slope control modified so that other audio components receiving the signals on lines 228 and 230 can make other adjustments to the signal.

The stereo speaker amplifier section 242 is coupled to the two channel tracking and stereo gain controller 206 through lines 228 and 230. A pair of DC controlled power amplifiers IC6 and IC7 are used, in which the volume in the speakers increases with an increased DC input to pin 5 of each amplifier IC6 and IC7. To obtain the desired balance between the two speakers resistor R28 is adjusted to provide a portion of the control voltage from the resistors in the override switch section 212 to each amplifier. In preferred embodiments, the amplifiers IC6 and IC7 are type TDA 7056A amplifiers manufactured by Phillips, Inc. However, in alternative embodiments, other types of DC gain controlled power amplifiers may be used. Alternatively, a non-DC controlled amplifier may be used with dual potentiometers by those skilled in the art, to accomplish the same functions.

Figure 10:
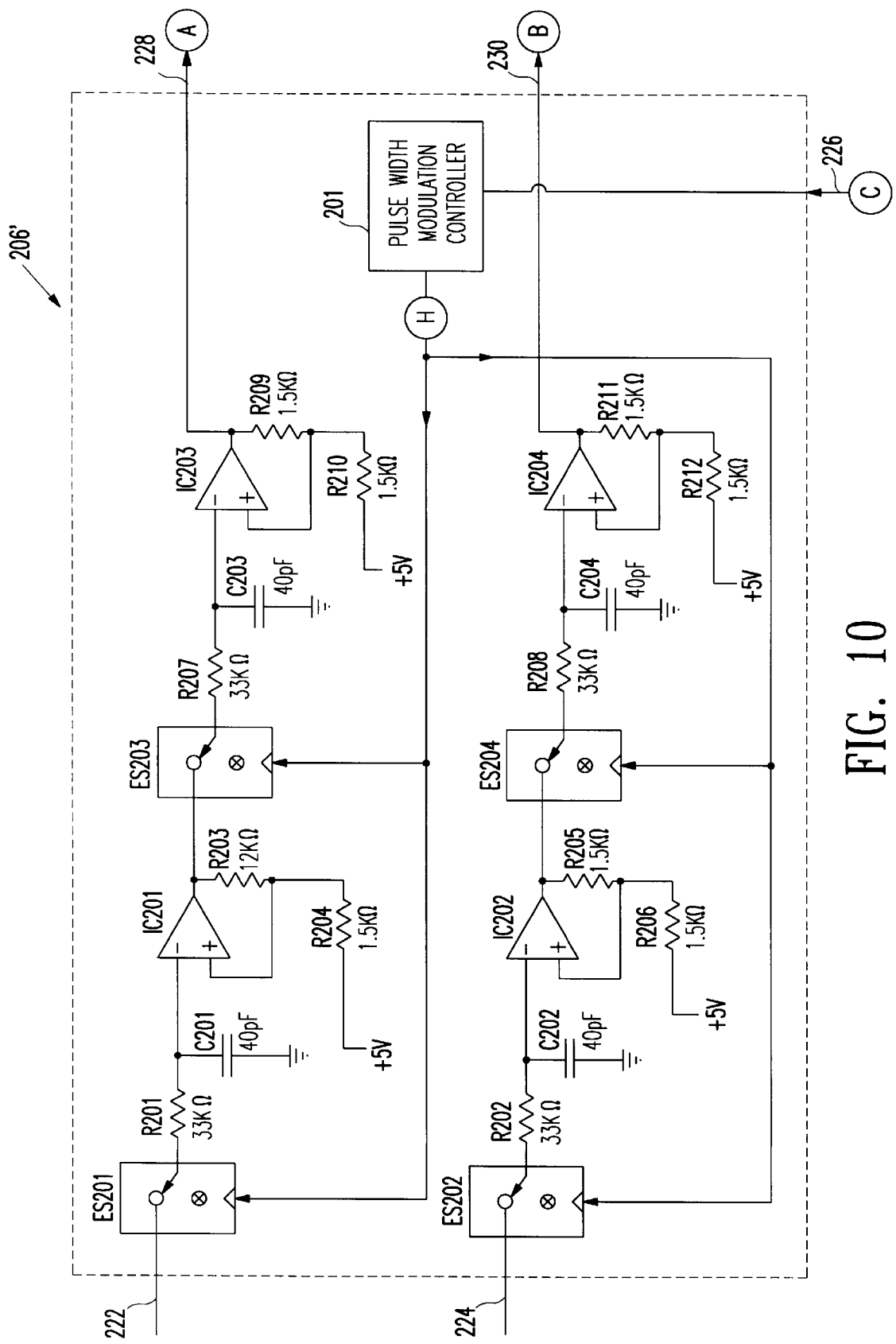
FIG. 10 is a detailed schematic diagram of an alternative two channel tracking stereo gain control module for use with the circuit shown in FIGS. 5(a)–5(d).

FIG. 10 is a detailed schematic of an alternative two channel tracking stereo gain control module 206' for use with the circuit shown in FIGS. 5(a)–5(d). This embodiment receives a signal from the filters and amplifiers section 204 on line 222 at an electronic switch ES201. The output of the electronic switch ES201 is coupled to an operational amplifier IC201, which is in turn coupled to a second electronic switch ES203. The output of the second electronic switch ES203 is coupled to a second operational amplifier IC203 which produces an output on line 228 The electronic switches ES201–ES204 are operated by a pulse width modulator controller PWMC201 to reduce the overall gain of the signal. For instance, if the duty cycle output from the pulse width modulation controller PWMC201 is 0.1 the overall gain reduction caused by the switches ES201 and ES203 is 0.01 (i.e., 0.1×0.1). This gain reduction is compensated for by the individual gains on the operational amplifiers IC201 and IC203. The other channel signal on line 224 is handled in a similar manner. In preferred embodiments, the electronic switches ES201–204 are formed from one quad CMOS switch of type MC14066 manufactured by Motorola, Inc, and the operational amplifiers are similar to IC1 and IC2 described above. However, in alternative embodiments, different electronic switches and operational amplifiers may be used. This configuration also allows for the use of a digital control system or digital to analog converters (DAC) arranged as X-Y multipliers, so that each DAC tracks in gain.

Figure 11:
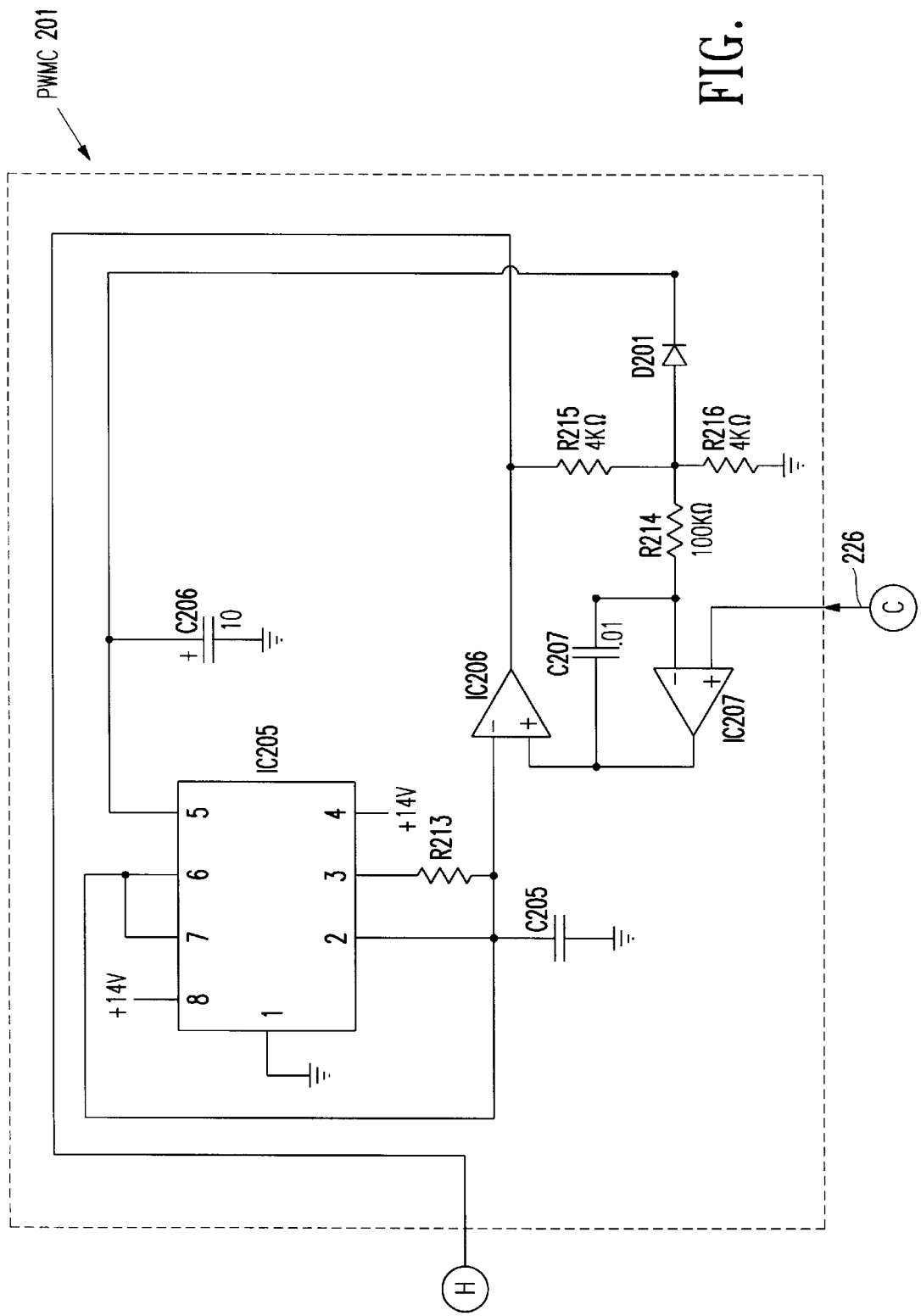
FIG. 11 is a detailed schematic diagram of a pulse width modulation circuit used with the embodiment shown in FIG. 10.

FIG. 11 is a detailed circuit schematic of a pulse width modulation controller PWMC201 used with the embodiment shown in FIG. 10. The PWMC201 produces a pulse width that is linearly proportional to the control signal input on line 226 from the auto-level amplifiers and threshold integrator 210. This is because the output of operational amplifier IC206 is filtered and applied to the inverting input of operational amplifier IC207 and compared to the input control signal on line 226 from the auto-level amplifiers and threshold integrator 210. In preferred embodiments resistors R113 and R114 are chosen to produce a frequency of approximately 50 khz, since this is sufficient for sampling nominal audio frequency ranges. In preferred embodiments, IC205 is a TLC555 timer manufactured by Texas Instruments, and operational amplifiers IC206 and IC207 are similar to IC1 and IC2 described above. However, in alternative embodiments, a single pulse width modulation chip may be used or different timer and operational amplifier chips can be used.

Figure 12:
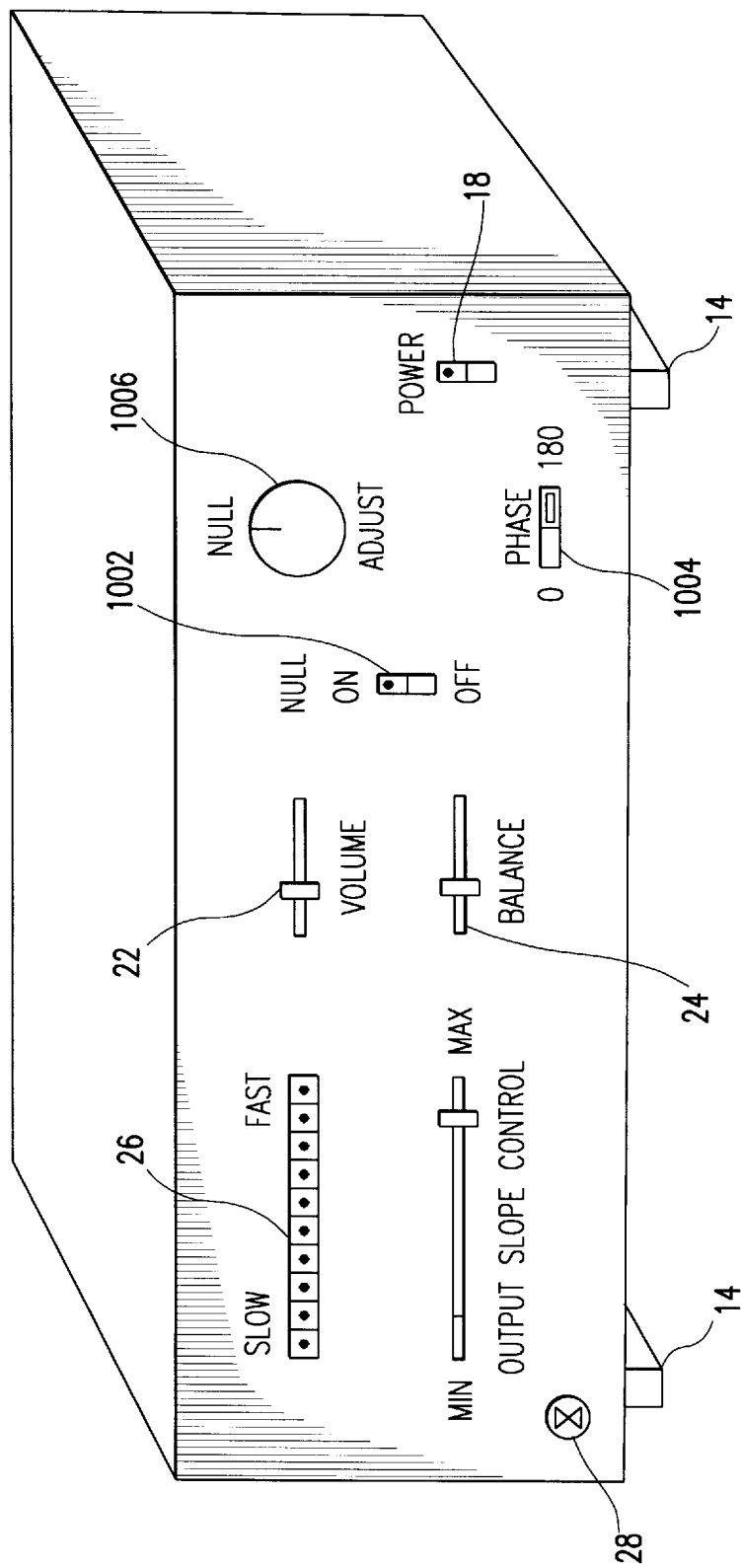
FIG. 12 is a perspective view of a sound leveling system in accordance with a second embodiment of the present invention.

FIG. 12 illustrates a perspective view of a second embodiment of a sound leveling system 1000, which is similar to the sound leveling system 10 described above. However, the sound leveling system 100 further includes a voice nulling circuit which allows the user to essentially cancel out, or substantially reduce, the voice energy portions of programs and commercials. The voice nulling circuitry takes advantage of the fact that many commercials or programs having voice portions transmit the voice signal energy equally in each channel. Thus, if the phase in one channel is changed by 180°, the inverse, duplicate voice signals should cancel out (i.e., "null" out) the voice signal energy and leave only the stereo components.

As shown in FIG. 12, the sound leveling system 1000 includes a null on/off switch 1002, a phase switch 1004, and a voice nulling control 1006. The null on/off switch 1002 is used to direct signals through the voice nulling circuitry, and essentially converts the output signal from stereophonic to monophonic. The phase switch 1004 allows the input signal in one channel to be switched 180° in phase, since this may be required to null out the voice energy portion of a program. The voice nulling control 1006 is used to balance the voice nulling circuitry and achieve the maximum amount of voice nulling, which would be a function of input signal programs.

Figure 13A:
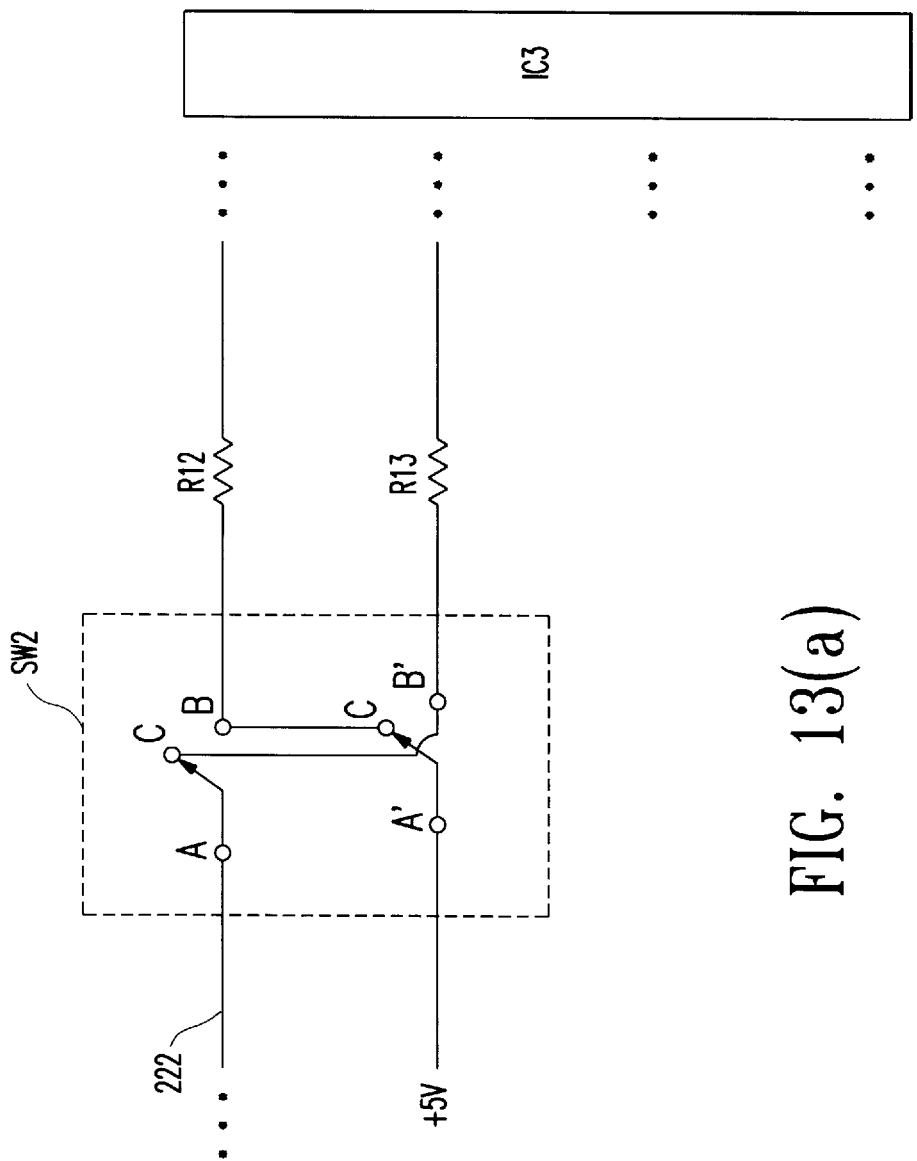
FIG. 13 is partial schematics of voice nulling circuits used in the embodiment illustrated in FIG. 12.
Figure 13B:
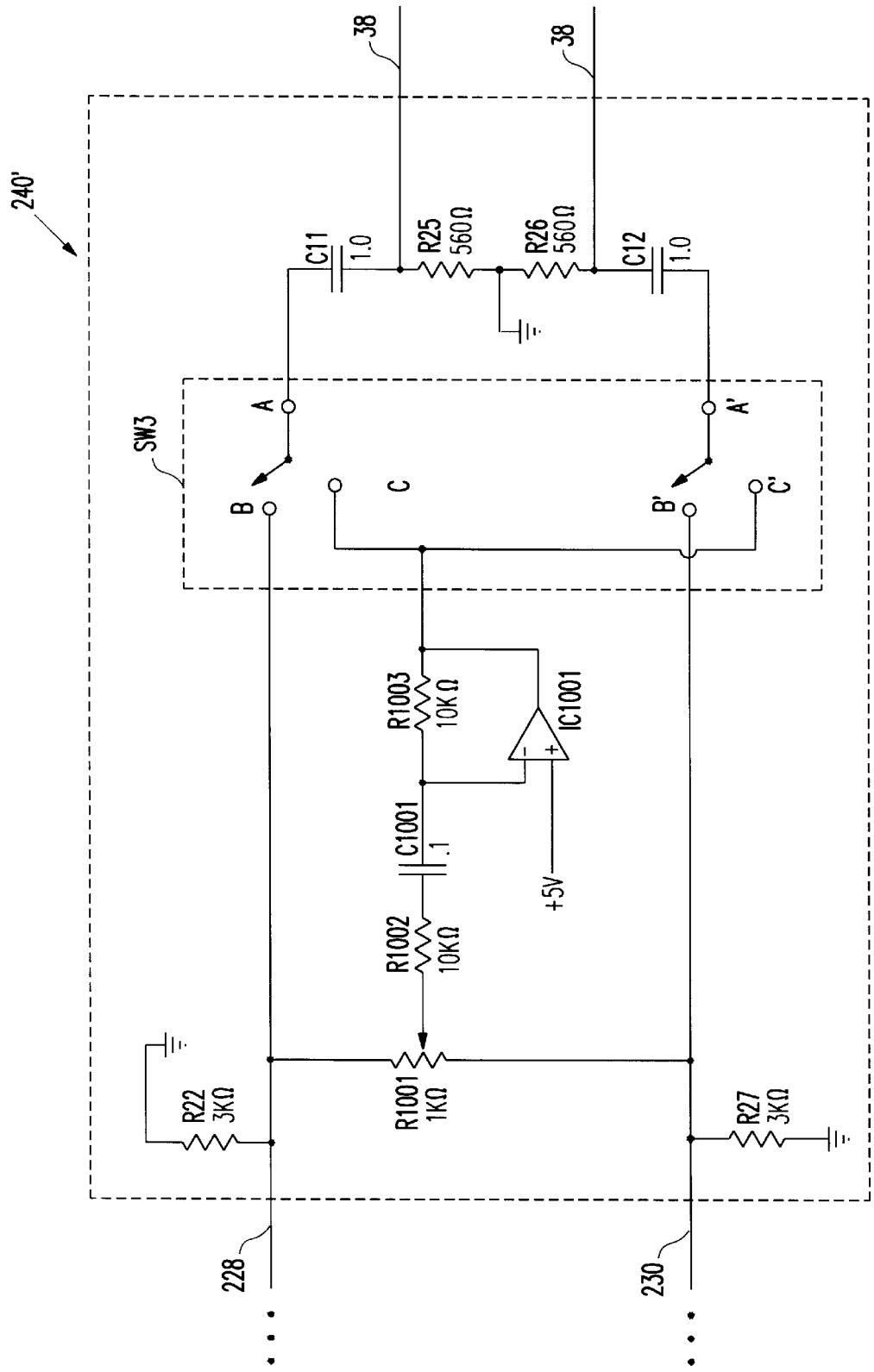

FIGS. 13(a) and 13(b) illustrate the voice nulling circuits that can be used in the detailed circuit illustrated in FIGS. 5(a)–5(d) to null out the voice energy portions of a signal. FIG. 13(a) shows the phase altering switch for inverting the phase (i.e., by 180°) of the signal on line 222 that is inputted to IC3. The phase switch 1004 is inserted between the input signal on line 222, the virtual floating ground of +5 V and Resistors R12 and R13 that are coupled to the inputs of an operational amplifier contained in IC3. Line 222 and the virtual ground of +5 V are coupled to switch SW2. When the phase switch 1004 is in the non-adjusting, in-phase position (i.e., A to B, and A' to B'), the switch 1004 passes the signal on line 222 to resistor R12 and the virtual ground to resistor R13. When the phase switch 1004 is in the adjusting, phase-inverting position (i.e., A to C, and A' to C'), the switch 1004 passes the signal on line 222 to resistor R13 and the virtual ground to resistor R12. Although SW2 is described as a dual line switch, other switches, such as a pair of switches, signal inverters or the like may be used.

FIG. 13(b) illustrates the voice nulling circuitry, which is coupled between lines 228 and 230 inside the line output section 240'. This circuitry essentially replaces the line output section 240 described above in the previous embodiment. When the voice nulling circuitry is not used, the signals on lines 228 and 230 are coupled to the switch SW3 (which is connected A to B, and A' to B'), which is controlled by the null on/off switch 1002. The output of the switch SW3 is coupled to the resistor and capacitor network to produce the proper level signals at line outputs 38 in a manner similar to that described in the previous embodiment. When the voice nulling circuitry is used, lines 228 and 230 are coupled together through a resistor R1001. Balance between the signals on the two signal lines 228 and 230 is accomplished by adjusting the pickoff point between resistor R1002 and resistor R1001 with the voice nulling control 1006. The resistor R1002 and capacitor C1001 are coupled to the negative input of an operational amplifier IC1001, and virtual ground is connected to the positive input of IC1001. The output of IC1001 is fed back through resistor R1003 into the negative input of IC1001. The output of IC1001 is fed through switch SW3 (i.e., connected A to C, and A' to C') to produce a plurality of duplicate monophonic signals at line outputs 38. Thus, with proper altering of the switches on the sound leveling system 1000, the voice energy portions of a transmitted signal can be effectively removed or suppressed from the rest of the audio signal.

Figure 14:
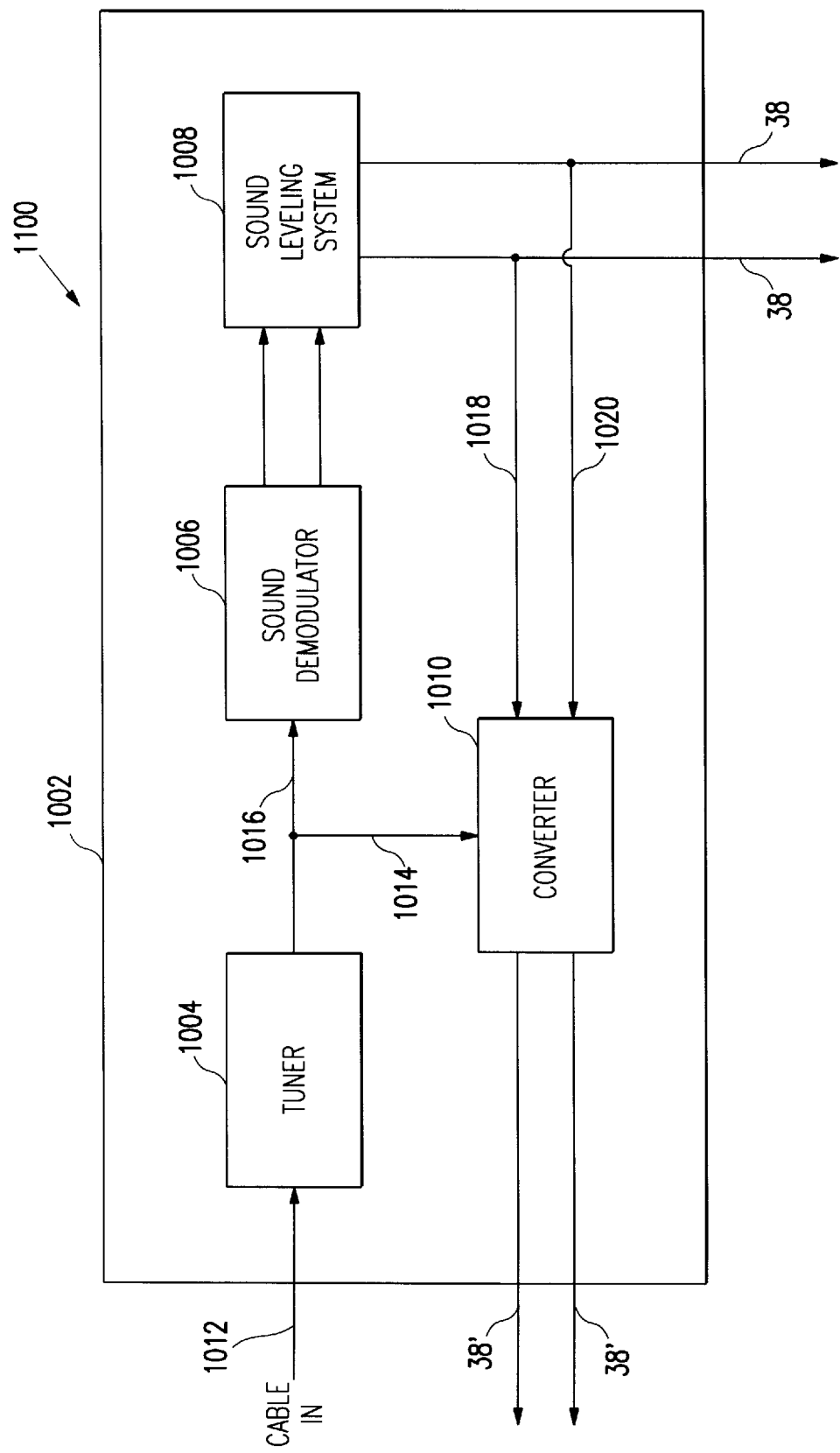
FIG. 14 is a simplified functional block diagram for a sound leveling system in accordance with a third embodiment of the present invention.

FIG. 14, illustrates a third embodiment of a sound leveling system 1100 in accordance with the present invention. This embodiment utilizes a sound leveling system inside a cable decoder box 1002 that contains a tuner 1004, a sound demodulator 1006, a sound leveling system 1008, and a convertor 1010. The tuner 1004 receives a signal from a standard coaxial/triaxial cable line 1012 and processes the signal for the selected channel. If the sound leveling system circuitry 1008 is not utilized, the non-audio portion of the signal from the tuner 1004 is sent to the converter 1010 over line 1014. The converter 1010 then converts the signal in the normal manner and outputs the signal on line outputs 38'. If the sound leveling system 1008 is utilized, the signal from the tuner is still sent to the converter over line 1014. However, the audio carrier signal is also sent to a sound demodulator 1006 over line 1016. The sound demodulator converts the signal from the tuner 1004 into inputs that can be received and processed by the sound leveling system 1008 as described above in the previous embodiments. The sound leveling system 1008 outputs the signal at line outputs 38 and provides the sound leveled signals to the converter 1010 on lines 1018 and 1020. If a sound leveled signal is received from the sound leveling system 1008, the convertor will output the sound leveled audio potion of the signal on line 38' with the converted video portion of the signal, and controls and displays may be minimized.

In an alternative embodiment, the sound leveling system may be used in the transmitter of a signal. This alternative allows a cable operator or broadcaster to prelevel the signal before it is transmitted to remote sites. The signal is processed by a sound leveling system prior to modulating the sound signal. In preferred embodiments, the ability to sound level the signal is selectable and may be coupled to a computer or data processor to only implement the sound leveling system at specific times, for example, only during the transmission of commercials in the signal, but not during the regular program material, or during public addresses or background music uses.

In another alternative embodiment, the sound leveling system may be implemented with a data processor or a microprocessor utilizing software and hardware to level the audio signal in a manner similar to that described in the previous embodiments. However, the sound leveling system could be programmed to function differently such as only selectively adjusting particular sound frequencies or by only adjusting the portions of a signal above particular magnitudes without altering the portions below the particular magnitude. This may be programmed into digital signal processor (DSP) chips or the like.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A sound leveling system for receiving an input signal, wherein when a maximum amplitude of the input signal equals or exceeds a control threshold the sound leveling system maintains an output signal at or below a slope defining a plurality of predetermined maximum output levels for a set level of output control, wherein the slope represents a ratio of the output signal to the input signal, the system comprising:

an signal adjusting circuit for receiving the input signal and a control signal to produce the output signal that is output by the system;

an integrator circuit coupled to the signal adjusting circuit to receive and sample the output signal from the signal adjusting circuit, the integrator circuit determining a maximum amplitude of the output signal and using the maximum amplitude to produce the control signal that determines a rate of response of the system and further determines the control threshold in accordance with the set level of output control applied to the output signal; and a peak rate limiter circuit coupled to the integrator circuit to limit the rate of response of the integrator circuit during large changes in the amplitude of the output signal to substantially eliminate loss of the output signal during the large changes in the amplitude of the output signal, wherein the signal adjusting circuit uses the control signal from the integrator circuit to produce a gain that adjusts the amplitude of the output signal in accordance with the control signal such that the maximum amplitude of the output signal is maintained at or below the slope defining the plurality of predetermined maximum output levels for the set level of output control, wherein the output signal is comprised of two output channel signals, wherein each channel may be the sum of more than one input, wherein the input signal is comprised of two input channel signals, and wherein the signal adjusting circuit tracks the gain for each input channel signal and adjusts the gain for each output channel signal and the system further including an inverting circuit for inverting the phase of one input channel signal and a voice nulling circuit, wherein the input signal contains voice energy portions, and wherein the voice nulling circuit uses the inverted and the non-inverted input channel signals to substantially cancel the voice energy portions in the two output channel signals.

2. A sound leveling system for receiving an input signal and for producing an output signal, the system comprising:

a signal adjusting circuit for receiving the input signal and a control signal to produce the output signal that is output by the system;

an integrator circuit coupled to the signal adjusting circuit to receive and sample the output signal from the signal adjusting circuit, the integrator circuit determining a maximum amplitude of the output signal and using the maximum amplitude to produce the control signal that determines a rate of response of the system and further determines a control threshold in accordance with a set level of output control applied to the output signal;

a peak rate limiter circuit coupled to the integrator circuit to limit the rate of response of the integrator circuit during large changes in the amplitude of the signal to substantially eliminate loss of the output signal during the large changes in the amplitude of the signal, wherein the signal adjusting circuit uses the control signal from the integrator circuit to produce a gain that adjusts the amplitude of the output signal in accordance with the control signal such that the maximum amplitude of the output signal is maintained at or below a slope defining a plurality of predetermined maximum output levels for the set level of output control, wherein the output signal is comprised of two output channel signals, wherein each channel may be the sum of more than one input, wherein the input signal is comprised of two input channel signals, and wherein the signal adjusting circuit tracks the gain for each input channel signal and adjusts the gain for each output channel signal; and an inverting circuit for inverting the phase of one input channel signal and a voice nulling circuit, wherein the input signal contains voice energy portions, and wherein the voice nulling circuit uses the inverted and the non-inverted input channel signals to substantially cancel the voice energy portions in the two output channel signals.

* * * * *